United States Patent [19]

Caudel et al.

[11] 4,147,984
[45] Apr. 3, 1979

[54] DUAL DIGITAL PROCESSOR TRANSCEIVER

[75] Inventors: Edward R. Caudel, Dallas; William R. Wilson, Garland; Thomas E. Merrow, Dallas, all of Tex.

[73] Assignee: Texas Instruments Incorporated, Dallas, Tex.

[21] Appl. No.: 791,616

[22] Filed: Apr. 27, 1977

[51] Int. Cl.$^2$ .............................................. H04B 1/40
[52] U.S. Cl. ........................................ 325/25; 325/64; 325/67; 325/164; 325/397
[58] Field of Search ...................... 325/15, 25, 16, 64, 325/67, 163, 164, 171, 397, 398, 399, 400

[56] References Cited
U.S. PATENT DOCUMENTS
3,701,945  10/1972  Gallant ................................. 325/25

*Primary Examiner*—Robert L. Griffin
*Assistant Examiner*—Michael A. Masinick
*Attorney, Agent, or Firm*—Stephen S. Sadacca; James T. Comfort; Melvin Sharp

[57] ABSTRACT

A transceiver includes a keyboard having a plurality of manually actuable keys for selecting operating modes and channels for operating thereon. A first digital processor has inputs coupled to the keyboard for receiving logic signals therefrom of a first format identifying the keys which are manually actuated. In response thereto, the first digital processor generates bit serial messages of a second format indicating the manually chosen operating mode and channel. A second digital processor has inputs coupled to receive the bit serial messages. In response thereto, the second digital processor generates a plurality of micro commands. A clocking signal generator circuit and switching circuit are coupled to receive the micro commands to control the transceiver.

12 Claims, 30 Drawing Figures

MIXER 200

MIXER 300

CCD-FILTER 700

VOLUME CONTROL 1000

CLOCKING MODULE 3000

CLOCKING MODULE 3100

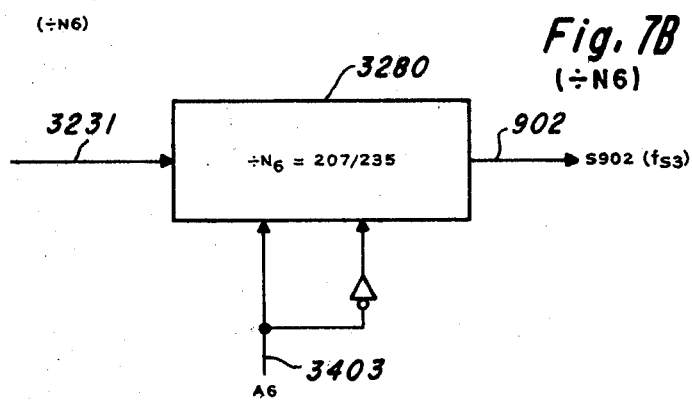

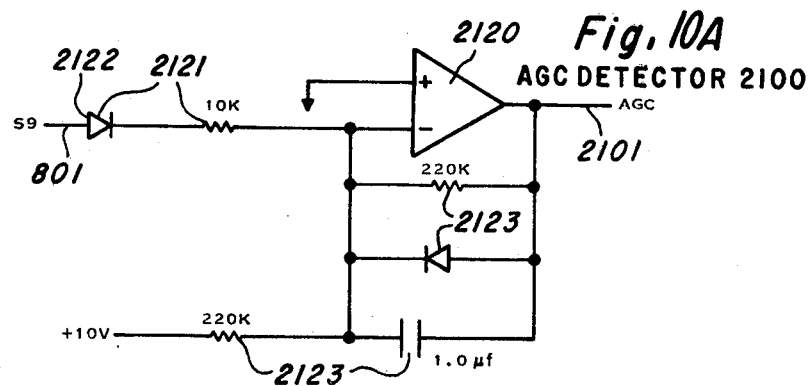
*Fig. 10A*
AGC DETECTOR 2100
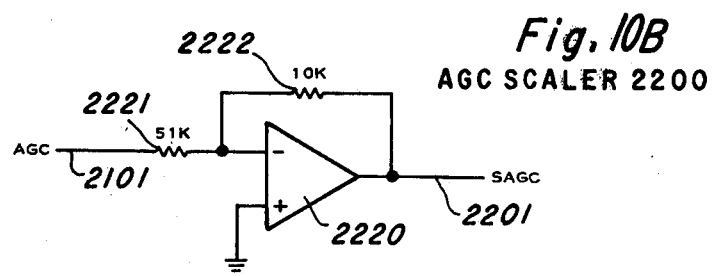
*Fig. 10B*
AGC SCALER 2200
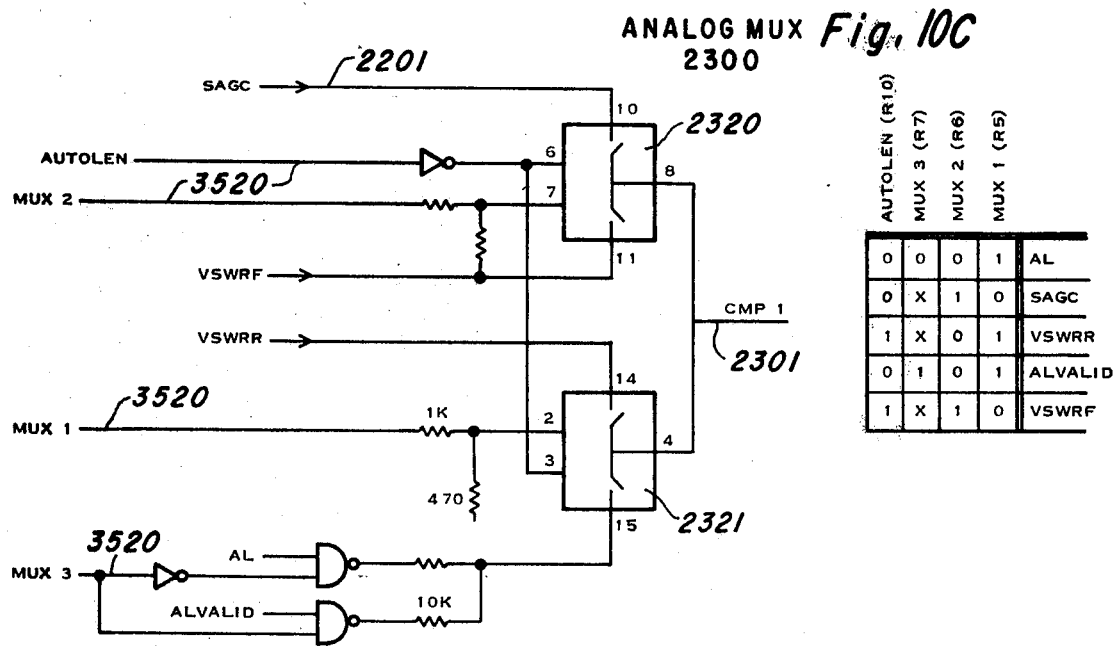
ANALOG MUX *Fig. 10C*
2300

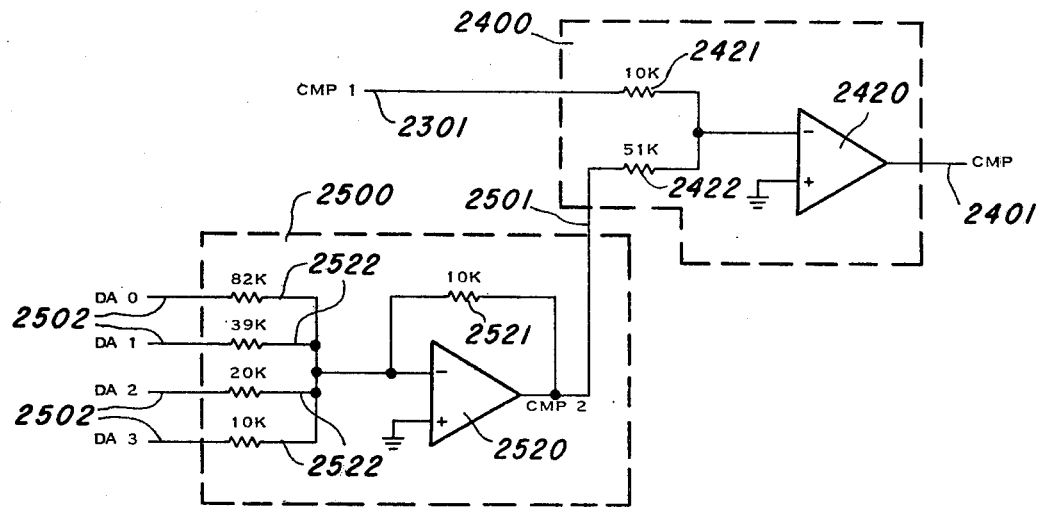
Fig. 10D D-A CONV 2500 AND COMPARATOR 2500
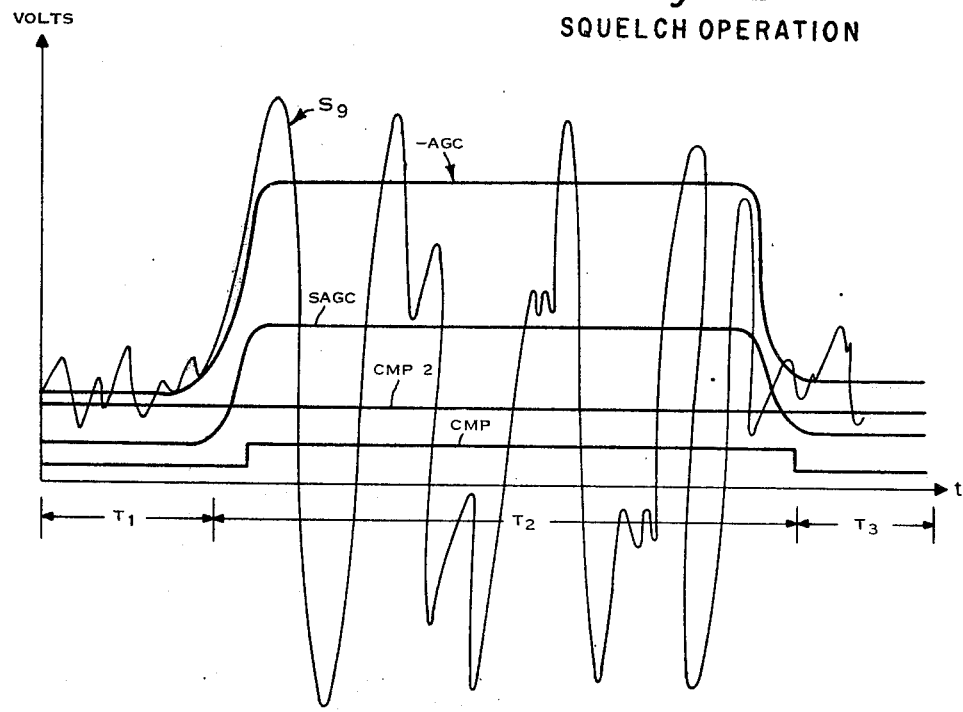
Fig. 10E SQUELCH OPERATION

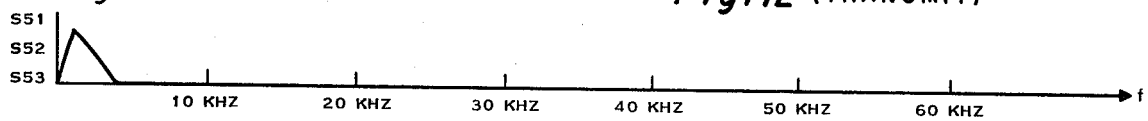
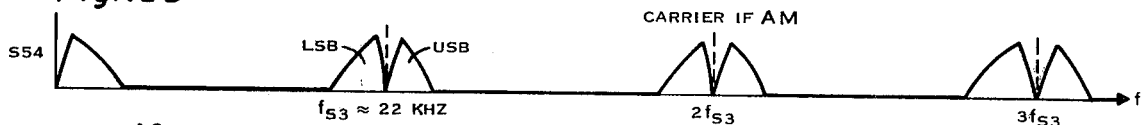
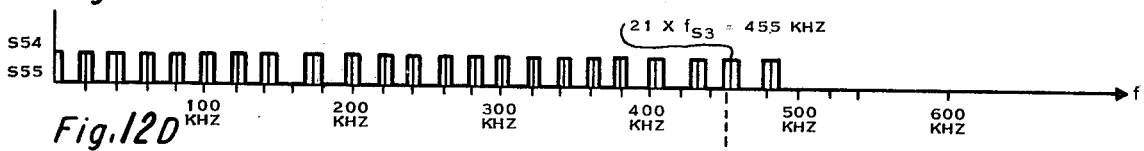
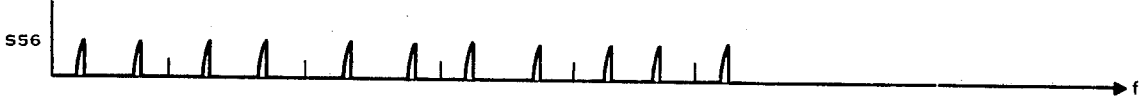
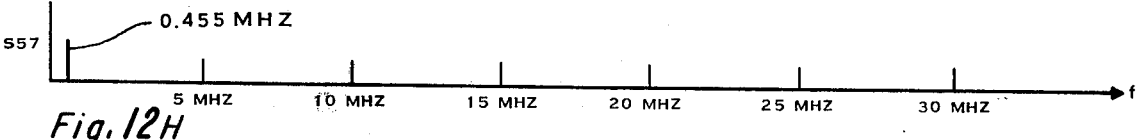
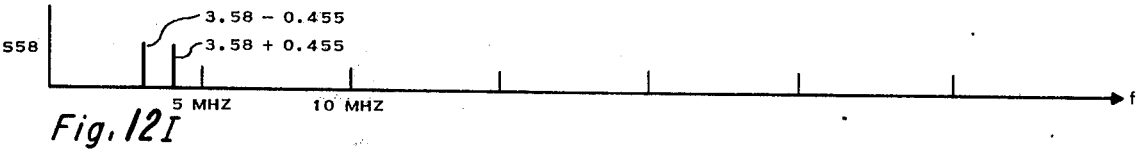
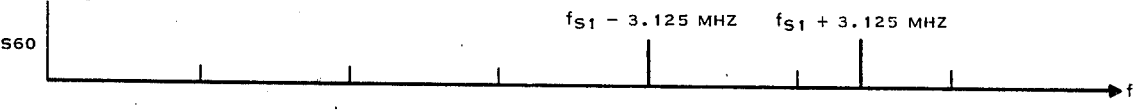
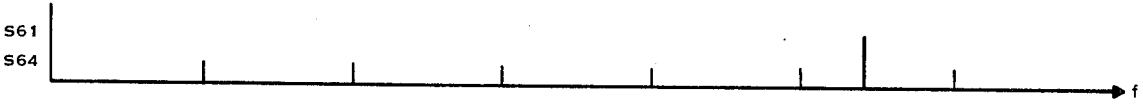

SWITCH 5200

MIXER 5500

MIXER 5700

SWR 6100

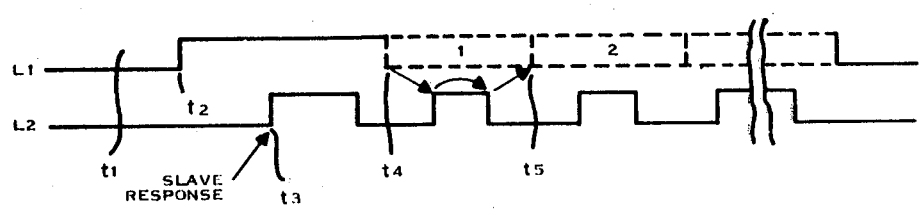
Fig. 16 A
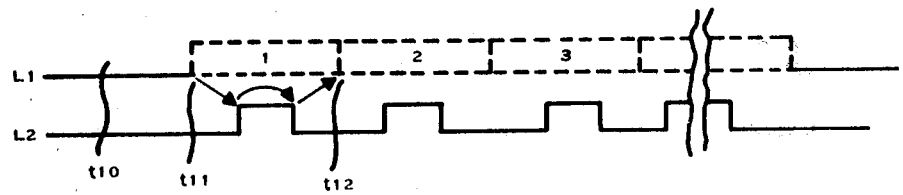
Fig. 16 B
Fig. 16 C
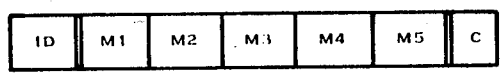

DUAL DIGITAL PROCESSOR TRANSCEIVER

BACKGROUND OF THE INVENTION

This invention further relates to the Transmitting Transceiver" by Edward R. Caudel and William R. Wilson; U.S. Ser. No. 791,629 entitled "A Clarifying Radio Receiver" by Michael J. Cochran and Edward R. Caudel; U.S. Ser. No. 791,449 entitled "An Automatically Clarifying Radio Receiver" by Michael J. Cochran and Edward R. Caudel; U.S. Ser. No. 791,254 entitled "A Computer Controlled Radio System" by Michael J. Cochran and Edward R. Caudel; U.S. Ser. No. 791,450 entitled "A Transceiver With Only One Reference Frequency" by Michael J. Cochran; U.S. Ser. No. 791,614 entitled "A Charge Transfer Device Radio System" by Michael J. Cochran; U.S. Ser. No. 791,265 entitled "A Signal Strength Measuring Transceiver" by Edward R. Caudel; U.S. Ser. No. 791,256 entitled "A Highly Selective Programmable Filter Module" by Michael J. cochran and Edward R. Caudel; U.S. Ser. No. 791,253 entitled "A Transceiver Capable of Sensing A Clear Channel" by Jerry D. Merryman, Michael J. Cochran and Edward R. Caudel; and U.S. Ser. No. 791,264 entitled "An Electronic Phase Detector Circuit" by Michael J. Cochran.

A transceiver has a transmit mode of operation and a receive mode of operation. In a receive mode, the transceiver receives radiated electronic input signals comprised of a plurality of non-overlapping frequency bands, filters one of the bands from the plurality, and converts the filtered band to audible sounds. The input signals may be amplitude modulated (AM) or single sideband signals (SSB), as an example. Similarly, in a transmit mode, a transceiver modulates electrical signals having audio frequencies, frequency shifts demodulated signals to radio frequencies of a selectable channel, and radiates the radio signals within the channel via an antenna.

In order to activate the above-indicated operations, some means must be provided for manually selecting the functions to be performed. To this end, a plurality of knobs or keys are typically provided. For example, some keys are provided for channel selection; other keys are provided for choosing a transmit or receive mode; and additional keys are provided for volume control. More sophisticated transceivers include an even greater number of keys for specifying additional functions. For example, keys may be provided for activating a sideband mode, an amplitude modulation mode, a clarifying function, a squelch function, or a selective call function.

In the past, each of these keys were individually coupled to circuitry which performed the indicated function. One of the problems with this architecture is that a large number of wires are required to couple the keys to the circuits which perform the functions. The problem becomes aggravated with sophisticated transceivers which have a larger number of keys for performing many functions. As a result of having a large number of intercoupling wires, the transceiver becomes difficult to package. For example, if the keys are packaged in a control head, and the implementing circuitry is a physically separate signal processor unit, then a large cable is required to intercouple the control head and the unit. Such a cable is both clumsy and aesthetically undesirable. Additionally, cables having large number of wires are relatively expensive.

Another problem with the above-described prior architecture is that the design is inflexible. For example, since the keys are hard-wired to the implementing circuitry, a change in the definition of a function frequently requires a change to that wiring. Further, it is difficult to add additional functions as features, since additional cable wires are required.

In comparison, the invention as herein described has none of the above identified problems. That is, a large number of operations can be manually selected via a control head without requiring a cable to the signal processing unit having a large number of wires. In one embodiment of the invention, a virtually unlimited number of functions can be specified by intercoupling the control head and processing unit with only two wires. As a result, the control head and its coupling cable is both inexpensive and aesthetically pleasing. Further, the design of the present invention is flexible in that additional functions can be added without any hardware changes and without adding additional wires in the intercoupling cable.

The invention as herein described has an added advantage over the prior art in that signals from the keyboard are preprocessed before they are received by the implementing circuitry in signal processing unit. That is, the control head includes centralized logic for converting signals from the keyboard to a format which is more readily useable by the implementing circuits. As a result, the implementing circuitry is simplified.

Accordingly, it is one object of the invention to provide an improved transceiver.

It is another object of the invention to provide a transceiver with the control head for selecting a large number of functions utilizing only a two-wire intercoupling cable.

Another object of the invention is to provide a transceiver having a control head in which additional functions can be added without hardwire changes.

Still another object of the invention is to provide a transceiver having a control head which pre-processes keyboard signals before they are sent to the implementing circuitry.

SUMMARY OF THE INVENTION

These and other objects are accomplished in accordance with the invention by a transceiver having a control head coupled to a physically separate signal processing unit via a two-wire cable. The control head includes a keyboard having a plurality of manually actuatable keys for selecting a variety of operating modes and channels. The control head includes a first processor having inputs coupled to the keyboard for receiving signals from the keyboard identifying keys which are manually actuated. In response to these signals, the first processor reassembles the signals into a second format which is more readily usable by the signal processing unit. The first processor has outputs coupled via the two-wire cable to a second processor in the signal processing unit for generating thereon bit serial messages of the second format. The second processor receives the bit serial messages, and in response thereto, sends microcommands to a plurality of counting and switching circuits within the control unit. These circuits act in response to the microcommands to thereby implement the manually selected operating modes.

DESCRIPTION OF THE DRAWINGS

The essential features believed to be characteristic of the invention are set forth in the appended claims; the invention itself, however, as well as other features and advantages thereof, may best be understood by referring to the following detailed description of the preferred embodiments when read in conjunction with the accompanying drawings; wherein:

FIGS. 7A-7B are detailed logic diagrams of a clocking module 3200 included within FIG. 2.

FIGS. 10A-10B are further detailed circuit diagrams of the transceiver of FIG. 2.

FIG. 12 comprises a series of frequency diagrams illustrating signals at various points on the transmit signal path of FIG. 11.

FIG. 16 is a timing diagram illustrating how messages are sent between the control unit of FIG. 15 and the processor of FIGS. 8 and 9.

DETAILED DESCRIPTION OF SPECIFIC EMBODIMENTS

Figure 1:
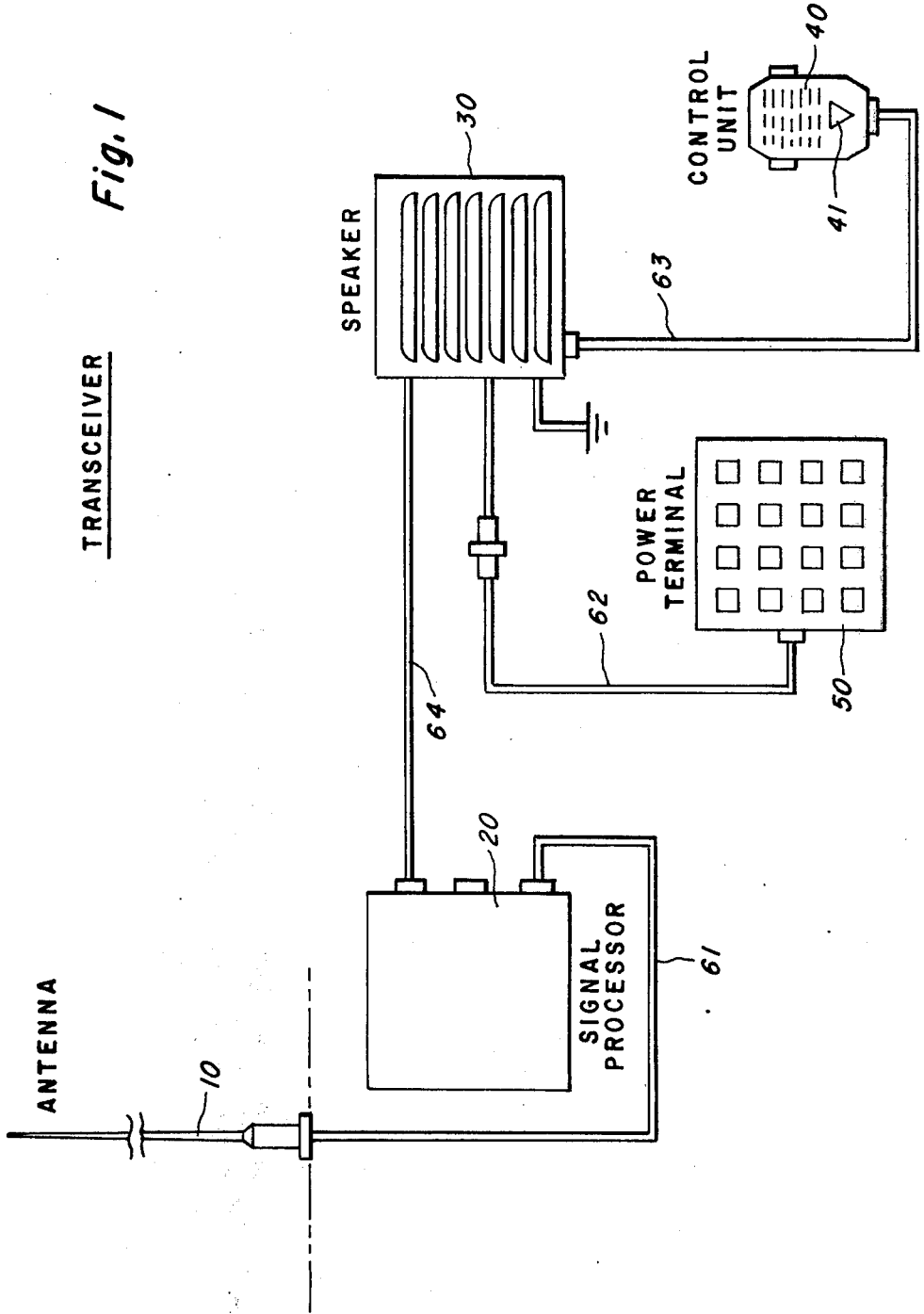
FIG. 1 is a block diagram illustrating the major components of a transceiver constructed according to the invention.

Referring now to FIG. 1, a block diagram illustrating the major components of a transceiver which is constructed according to the invention is illustrated. The transceiver is comprised of an antenna 10, a signal processing unit 20, a speaker 30, a control unit 40, and a power terminal 50. These components are electrically intercoupled by conductive cables 61-64 as illustrated in FIG. 1. The length of cables 61-64 are chosen to suit the particular environment in which the transceiver operates. For example, if the operating environment is an automobile, the length of cables 61-64 are chosen to permit operator access to speaker 30 and control unit 40, battery power connection to power terminal 50, operable mounting of antenna 10, and theft secure packaging of signal processor 20.

The transceiver of FIG. 1 has a transmit mode of operation and a receive mode of operation. Basically, in the transmit mode the operator speaks into a microphone 41 contained in control unit 40, and the audio signals are therein converted to electrical signals which are sent to analog signal processor 20 over cables 63 and 64. Signal processor 20 frequency shifts the received signal from an audio frequency to a frequency band of a selectable high frequency channel. The selected channel may be either a single sideband channel of approximately 5-kHz bandwidth, or an amplitude modulated channel of approximately 10 kHz. In either case the frequency shifted signals are sent via cable 61 to antenna 10 and therein transmitted via radiation.

In the receive mode, antenna 10 receives radiated electrical signals comprised of a plurality of frequency bands lying respectively within a plurality of non-overlapping frequency channels. The plurality of frequency bands are sent to signal processor 20 via cable 61. Signal processor 20 filters a selectable band from the plurality of bands, and down shifts in frequency the selected band to an audible frequency range. The selected down shifted frequency band is sent to speaker 30 via cable 64 where it is therein converted to audible sounds.

Figure 2:
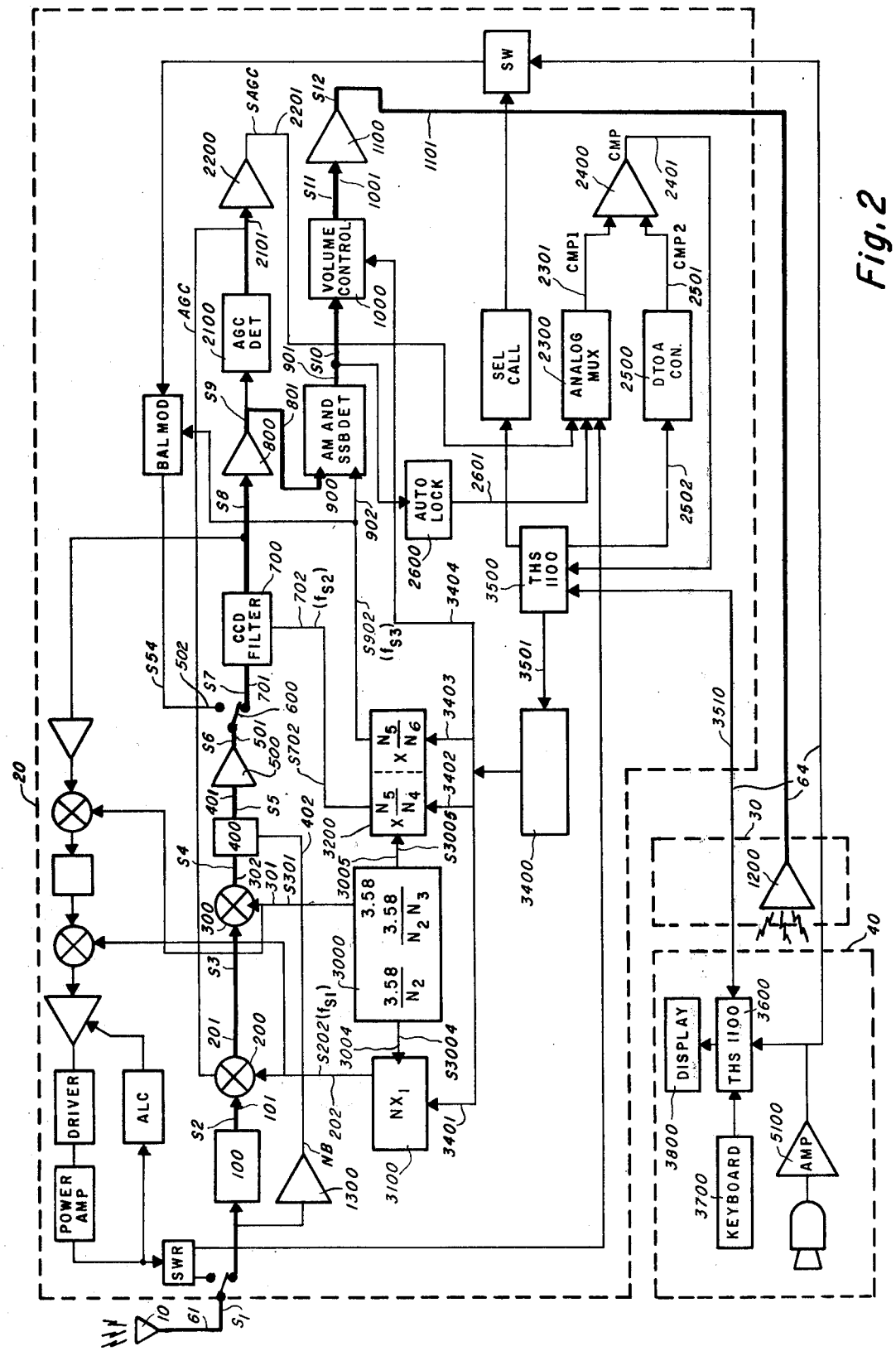
FIG. 2 is a more detailed block diagram of the transceiver of FIG. 1 wherein the receive signal path components are emphasized.
Figure 3:
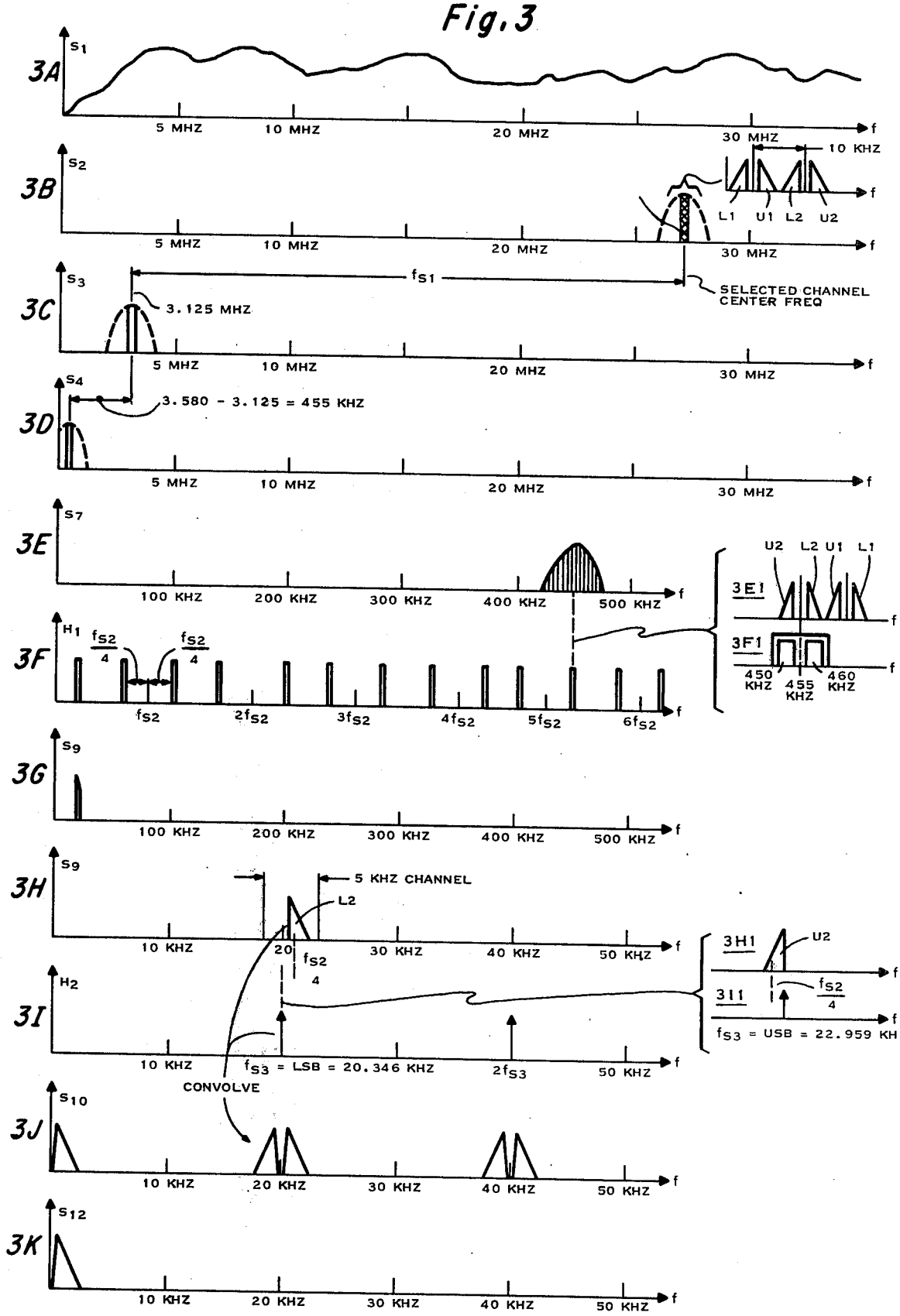
FIGS. 3A-3K are a set of frequency diagrams illustrating signals in the frequency domain which are present at various points on the receive signal path of FIG. 2.

The manner in which the transceiver of FIG. 1 performs the above described receive operation is best understood by referring to FIG. 2 and FIG. 3. FIG. 2 is a circuit diagram of the transceiver of FIG. 1. The circuit includes a signal path which is operable in the receive mode and which is emphasized in FIG. 2 by a thickened line. Signals S1-S12 are present at various points (as illustrated in FIG. 2) on this signal path. FIG. 3 is a set of frequency diagrams illustrating some of the signals S1-S12 in the frequency domain.

Antenna 10 is the first element of the receive signal path. Cable 61 couples to the output of antenna 10 and signal S1 as illustrated in Diagram 3a is generated thereon. Basically, signal S1 is unfiltered and thus is comprised of frequency components which cover the electromagnetic spectrum. Lead 61 couples to filter 100. Filter 100 has an output lead 101 and signals S2 are generated thereon. As illustrated in FIG. 3b, signal S2 has a frequency range of approximately 26 MHz to 28 MHz. The skirt response of filter 100 is not critical as its only function is to pass the band of frequencies lying between 26.965 MHz and 27.405 MHz. This range of frequencies includes 40 amplitude modulated (AM) channels as presently assigned by the FCC. Table I lists the center frequency of each of the 40 channels. Each AM channel is divided into a lower sideband channel and an upper sideband channel. FIG. 3b illustrates the 26.965 MHz-27.405 MHz frequency range by the cross hatched areas S2a. Diagram 3B1 is a blow up of area S2a and single sideband channels L1, U1, L2, U2, lying within the first two AM channels are illustrated therein.

TABLE I

| CH | CENTER FREQUENCY | CH | CENTER FREQUENCY |
| --- | --- | --- | --- |
| 1 | 26.965 | 20 | 27.205 |
| 2 | 26.975 | 21 | 27.215 |
| 3 | 26.985 | 22 | 27.225 |
| X | 26.995 | 24 | 27.235 |
| 4 | 27.005 | 25 | 27.245 |
| 5 | 27.015 | 23 | 27.255 |
| 6 | 27.025 | 26 | 27.265 |
| 7 | 27.035 | 27 | 27.275 |
| X | 27.045 | 28 | 27.285 |
| 8 | 27.055 | 29 | 27.295 |

TABLE I-continued

| CH | CENTER FREQUENCY | CH | CENTER FREQUENCY |
|---|---|---|---|
| 9 | 27.065 | 30 | 27.305 |
| 10 | 27.075 | 31 | 27.315 |
| 11 | 27.085 | 32 | 27.325 |
| X | 27.095 | 33 | 27.335 |
| 12 | 27.105 | 34 | 37.345 |
| 13 | 27.115 | 35 | 27.355 |
| 14 | 27.125 | 36 | 27.365 |
| 15 | 27.135 | 37 | 27.375 |
| X | 27.145 | 38 | 27.385 |
| 16 | 27.155 | 39 | 27.395 |
| 17 | 27.165 | 40 | 27.405 |
| 18 | 27.175 | | |
| 19 | 27.135 | | |
| X | 27.195 | | |

TABLE II

| CH | $f_{s1}$ | CH | $f_{s1}$ |
|---|---|---|---|
| 1 | 23.840 | 20 | 24.080 |
| 2 | 23.850 | 21 | 24.090 |
| 3 | 23.860 | 22 | 24.100 |
| X | 23.870 | 24 | 24.110 |
| 4 | 23.880 | 25 | 24.120 |
| 5 | 23.890 | 23 | 24.130 |
| 6 | 23.900 | 26 | 24.140 |
| 7 | 23.910 | 27 | 24.150 |
| X | 21.910 | 28 | 24.160 |
| 8 | 23.930 | 29 | 24.170 |
| 9 | 23.940 | 30 | 24.180 |
| 10 | 23.950 | 31 | 24.190 |
| 11 | 23.960 | 32 | 24.200 |
| X | 23.970 | 33 | 24.210 |
| 12 | 23.980 | 34 | 24.220 |
| 13 | 23.990 | 35 | 24.230 |
| 14 | 24.000 | 36 | 24.240 |
| 15 | 24.010 | 37 | 24.250 |
| X | 24.020 | 38 | 24.260 |
| 16 | 24.030 | 39 | 24.270 |
| 17 | 24.040 | 40 | 24.280 |
| 18 | 24.050 | | |
| 10 | 24.060 | | |
| X | 24.070 | | |

Lead 101 couples to the signal input of a mixer 200 which has an output lead 201 and signals S3 are generated thereon. Mixer 200 also has an input lead 202 for receiving clock signals of the first selectable frequency $f_{s1}$. The frequency $f_{s1}$ is chosen to equal the difference between the center frequency of the selected AM channel and the quantity 3.125 MHz. Mixer 200 generates signals S3 by mixing signal S2 with frequency $f_{s1}$, and thus the selected AM channel is centered at the frequency 3.125 MHz. This fact is illustrated in Diagram 3c. TABLE II lists the value of frequency $f_{s1}$ along side of the number of the selected AM channel.

Lead 201 couples to a second mixer 300. Mixer 300 has a clock input lead 301 and an output lead 302. A clocking signal of 3.58 mHz is applied to lead 301. Mixer 300 mixes signals S3 with the signal on lead 301 and, in response thereto, generates signals S4 on lead 302. As a result of the mixing operation, the selected AM channel in S4 is centered at frequency 455 kHz. Diagram 3d illustrates signal S4.

Signal S4 passes through a noise blanker 400, and noise blanker 400 is serially coupled to an amplifier 500. Signals S5 and S6 are generated by noise blanker 400 and amplifier 500, respectively. In general, the function of noise blanker 400 and amplifier 500 is to filter and amplify signal S4, but not to frequency shift signal S4. Thus, the center frequency of the selected channel is present in signal S6 at 455 kHz. Signal S6 is illustrated in the frequency domain in Diagram 3e.

In the receive mode, a switch 600 couples signals S6 to the input of a charge transfer device filter 700 via a lead 701. Charge transfer device filter 700 also has a clocking lead 702 for receiving clocking signals of a second selectable frequency $f_{s2}$. In response to the frequency $f_{s2}$, filter 700 generates output signals S8 on a lead 703.

In the preferred embodiment, charge transfer device filter 700 is a charge coupled device (CCD) transversal filter having a plurality of passbands which are programmable by varying the selectable frequency $f_{s2}$. Copending application, Ser. No. 758,366, entitled, "Frequency Converting Filter," by Jerry Norris and Clinton Hartmann, filed January, 1977, assigned to the same assignee of this application, contains a detailed description of its construction. Basically, the charge coupled device transversal filter is comprised of a plurality of serially connected stages having a split electrode structure defining an impulse response of the form (sine N/N) (cosine $2\pi f_0 N$). In this expression, the frequency $f_0$ equals $1/(N_0 \times t_s)$ where the quantity $1/t_s$ equals the selectable frequency $f_{s2}$, and $N_0$ is the number of stages over which the term cosine ($2\pi f_0 t$) completes one cycle. The bandwidth $\Delta f$ of each of the passbands equals $1/(t_s N_1)$ where the quantity $1/t_s$ again equals the selectable sampling frequency $f_{s2}$, and $N_1$ equals the number of stages in which the term (sine N)/N passes before reaching its first zero crossing. Copending application, Ser. No. 758,365, entitled, "Programmable Frequency Converting Filter," by Lawrence Reagan, filed Jan. 5, 1977, assigned to the same assignee of this application, describes how the passbands of a charge transfer device transversal filter are programmed in response to a clocking frequency.

In one preferred embodiment, the parameters $N_0$ and $N_1$ are chosen such that the passbands of filter 700 have a center frequency of $N \times f_{s2} + \frac{1}{4}f_{s2}$, and the bandwidth of filter 700 equals $1/20 f_{s2}$. Diagram 3f illustrates the frequency response of the charge coupled device filter having the above described characteristics. The function of the filter 700 is to receive signals S7 on lead 701, to filter a selected one of the channels (either AM or sideband) from the plurality of channels comprising signal S7, and to frequency shift the selected channel down in frequency.

If the selected channel is a single sideband channel, the channel has a width of approximately 5 kHz and thus filter 700 is clocked with a frequency $f_{s2}$ such that its passbands are approximately 5 kHz wide. In other words, the quantity $1/20 f_{s2}$ approximately equals 5 kHz when the selected channel is a single sideband channel. Additionally, the frequency $f_{s2}$ is chosen such that one of the multiple passbands of filter 700 aligns with the sideband channel to be selected from S7. In the preferred embodiment, the passband of filter 700 that is centered at $5f_{s2} + \frac{1}{4}f_{s2}$ is aligned with the sideband channel selected from signal S7. This is filter 700's eleventh passband. As illustrated in Table IIIa, a frequency $f_{s2}$ equal to 86,409 Hz aligns the center of the eleventh passband of filter 700 with frequency 450 kHz. And a clocking frequency $f_{s2}$ of 86,932 Hz aligns the center of the eleventh passband of filter 700 at 460 kHz. The width of both of these passbands is approximately 5 kHz. Diagram 3E1 is a blow up of signal S7 about the frequency of 455 kHz, and Diagram 3F1 is a blow up of Diagram 3F about the same frequency. Together, these figures illustrate the alignment of the eleventh passband of filters 700 with the selected channel. It should also be noted, as illustrated in Diagram 3E1, that the mixing operation of mixer 300 results in the flip-flopping in frequency of the upper and lower sideband channels. This flip-flopping occurs because the mixing frequency of 3.58 mHz is higher than the center frequency of the selected AM channel, i.e., 3.125 mHz.

The clocking frequency $f_{s2}$ is also chosen such that filter 700 has bandwidths of approximately 10 kHz, one of which is centered about the frequency of 455 kHz. Such a characteristic is used to pass an AM signal centered about 455 kHz. Table IIIb illustrates that a clocking frequency $f_{s2}$ equal to 202,218 Hz causes filter 700 to have its passband centered at 455 kHz and a bandwidth of approximately 10 kHz. This situation is also illustrated in Diagrams 3E1 and 3F1.

TABLE IIIa

| $\frac{1}{20} f_{s2}$ | $5f_{s2} + \frac{1}{4} f_{s2}$ | $f_{s2}$ |
|---|---|---|
| 5 kHz | 450 kHz | 86,409 Hz |
| 5 kHz | 460 kHz | 86,932 Hz |

TABLE IIIb

| $\frac{1}{20} f_{s2}$ | $2f_{s2} + \frac{1}{4} f_{s2}$ | $f_{s2}$ |
|---|---|---|
| 10 kHz | 455 kHz | 202,218 Hz |

Lead 703 couples the output of CCD filter 700 to an amplifier 800. Amplifier 800 is tuned to pass only those frequencies lying within the first passband of CCD filter 700. That is, amplifier 800 only passes frequencies lying about $\frac{1}{4} f_{s2}$. Amplifier 800 has an output lead 801 and signals S9 are generated thereon. Diagram 3G illustrates signal S9 on the same frequency scale as Diagram 3F (which illustrates the passbands of filter 700); and Diagram 3H illustrates signal S9 on an expanded frequency scale so that its characteristics are more apparent. In Diagram 3H, the signal S9 is illustrated as lower sideband channel L2 as an example.

Signal S9 is coupled to a demodulator 900 via the lead 801. Demodulator 900 functions to shift signals S9 in frequency to the audio range. When sideband signals are received, this shift in frequency is accomplished by time sampling signal S9 at a third selectable $f_{s3}$. Time sampling equals convolution in the frequency domain. Diagram 3I illustrates the frequency components of a sampling transfer function H2 which samples at a frequency $f_{s3}$ and Diagram 3J illustrates the convolution of signal S9 with transfer function H2. This convolution signal is labeled S10 and is generated on a lead 901.

In order to properly shift signal S9 to the audio frequency range by the convolution operation, it is necessary that the frequency $f_{s3}$ be carefully aligned frequencies of S9. When signal S9 is a lower sideband, frequency $f_{s3}$ is chosen to align with the lowest frequency present. Thus, in Diagram 3H, frequency $f_{s3}$ lies to the left of the quantity $f_{s2}/4$, and nominally is 20.346 kHz.

One difficulty in receiving single sideband signals is that they have no carrier to lock onto. Thus, the exact position in frequency of the signal S9 is unknown. All that is known is that the signal lies somewhere within its assigned 5 kHz channel; and therefore a problem exists in being able to align frequency $f_{s3}$ with signal S9 regardless of where the latter lies within its channel. The tone quality of the resulting audible signal is directly related to how well frequency $f_{s3}$ and signal S9 are aligned. Elements 3200–3500 provide a means for incrementally adjusting frequency $f_{s3}$ so as to be properly aligned with signal S9 regardless of where it lies within its 5-kHz channel.

As described above, amplitude modulated signals may also be received. In that case, frequency $f_{s2}$ equals 202,218; and therefore signal S9 which is centered at $f_{s2}/4$ has a center frequency of 50.555 kHz. Demodulator 900 shifts this signal to the audio range by a standard diode envelope detector which does not require a third sampling frequency.

Signal S10 couples via lead 901 to volume control unit 1000. Volume control unit 1000 has an output lead 1001 and signals S11 are generated thereon. Lead 1001 couples to an audio amplifier 1100 which has an output lead 1101 and signals S12 are generated thereon. Lead 1101 coupled to a speaker 30 where the signals S12 are converted to audible sounds. Diagram 3K illustrates signals S12 in the frequency domain and as therein illustrated they are proportional to the lowest band of frequencies comprising the convolution signal S10—the magnitude of signal S12 being controlled by the operation of volume control unit 1000 and amplifier 1100.

Some of the components comprising the signal path on which signals S1–S12 are generated are illustrated in detail in FIGS. 4A–4D. Filter 100 filters the frequencies 26 Hz to 28 Hz from the incoming frequency spectrum.

Figure 4A:
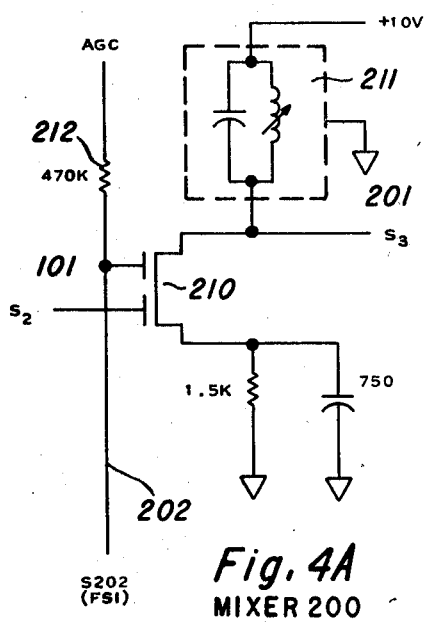
FIGS. 4A-4D are detailed circuit diagrams of some of the components comprising the signal path of FIG. 2.

Mixer 200 is illustrated in detail in FIG. 4A. Basically, mixer 200 is comprised of a dual gate MOSFET 210. One of the dual gates couples to signal S2 via lead 101, and the other gate couples to signal S202 via lead 202. The conductance of FET 210 is proportional to the product of the signals on its two gates. Signal S3 on lead 201 is generated at the source of FET 210, and thus it equals the product of signals S2 and S202. A tank circuit 211 having a resonant frequency of 3.125 mHz couples to lead 201. A logic signal FEO couples to the drain of FET 210 through a 10-K resistor 212. When signal FEO is at a high voltage, the gain of mixer 200 increases; whereas, when signal FEO is low, the gain of mixer 200 decreases. Signal FEO is thus utilized to logically step the gain of mixer 200 by approximately 40 dB.

Figure 4B:
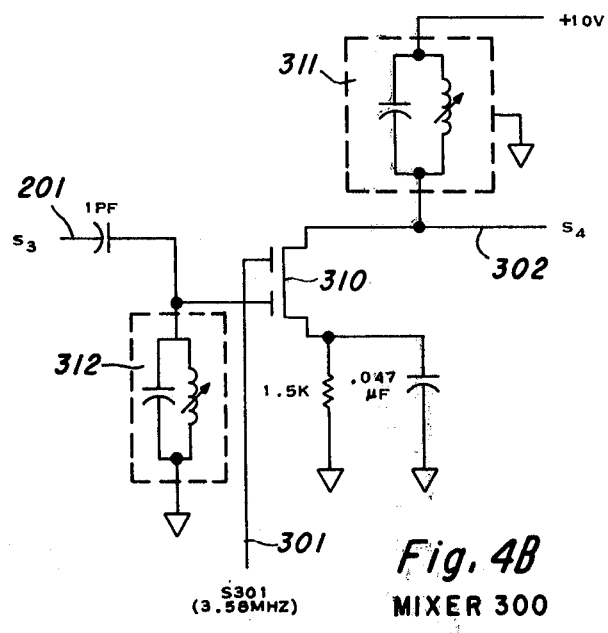

FIG. 4B is a detailed circuit diagram of mixer 300. Mixer 300 is also comprised of a dual gate MOSFET 310. One of the dual gates couples to signal S3 via lead 201, and the other gate couples to signal S301 via lead 301. A bias circuit 312 couples lead 201 to minus 8 volts. A tank circuit 311, having a resonant frequency of 455 kHz, serially couples ten-volts to the source of FET 310 where signal S4 on lead 302 is generated.

Figure 4C:
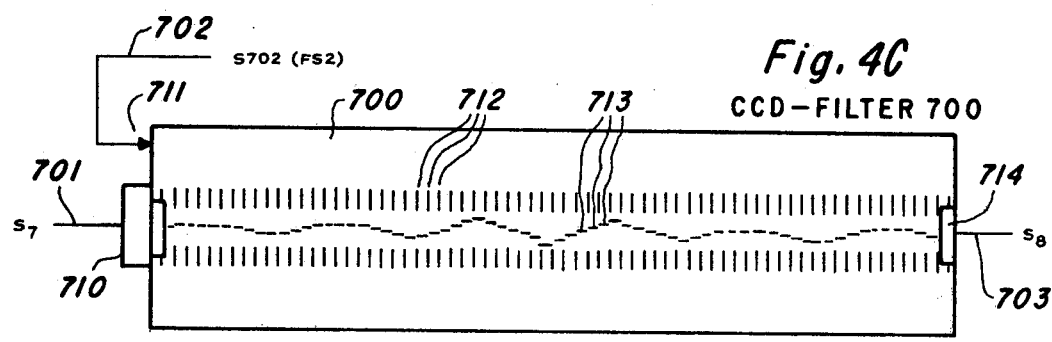

FIG. 4C is a greatly enlarged top view of CCD transversal filter 700. Lead 701 couples to an input stage 710 of filter 700. Lead 702, carrying clocking signals of the second selectable frequency $f_{s2}$, couples to the clocking input 711 of filter 700. As previously described, filter 700 is comprised of a plurality of serially-connected stages 712; and each of the stages has a split electrode. These splits 713 have a profile of the form (sine N/N) (cosine $2\pi f_0 N$). This structure has a plurality of passbands centered about multiples of the frequency $f_{s2}$ as previously described. Lead 703 couples to an output stage 714 of filter 700, and the signals S8 are generated thereon.

Figure 4D:
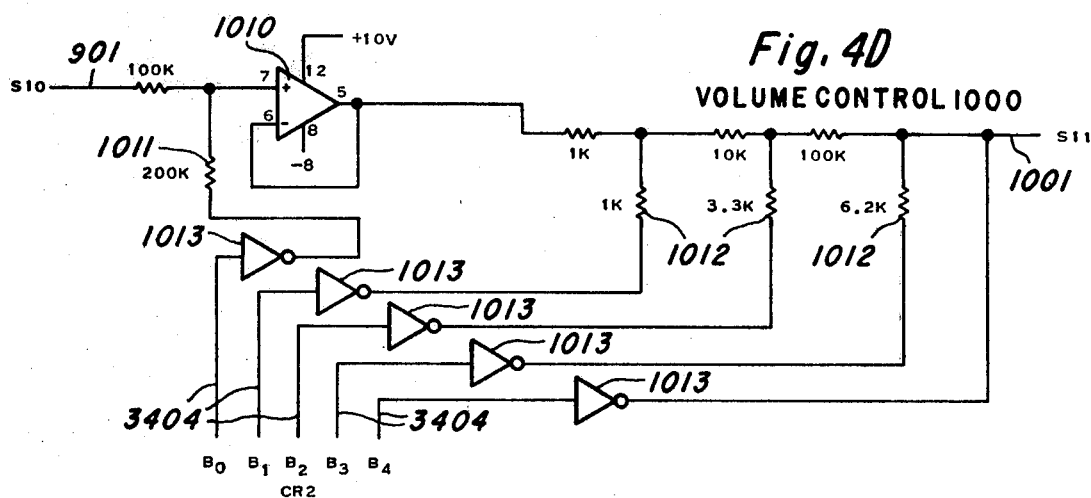

Volume control unit 1000 is illustrated in detail in FIG. 4D. The volume control unit is comprised of an operational amplifier 1010 having an input coupled to lead 901. The output of operational amplifier 1010 is coupled to lead 1001 and signal S11 is generated thereon. Logic gates 1013 are provided to control the input impedance and output impedance of operational amplifier 1010 to thereby control the magnitude of signal S11. Leads 1002 coupled to the input of logic gates 1013 and logic signals B1-B4 are applied thereto. The outputs of gates 1013 couple a 200-K resistor 1011 to the input of amplifier 1010; and couple various resistors 1012 to the output of amplifier 1010 in response to logic signals B0-B4.

As the preceding description indicates, the operation of the transceiver of FIG. 2 is dependent upon the proper generation of three selectable frequencies $f_{s1}$, $f_{s2}$, and $f_{s3}$. The clocking means for generating these frequencies will now be described. FIG. 2 illustrates these clocking means in block diagram form. They are comprised of clocking modules 3000, 3100, and 3200. Basically, module 3000 generates signal S301 which is comprised of a fixed frequency of 3.58 mHz. Module 3000 also generates signals S3004 and S3005 on leads 3004 and 3005, respectively. Lead 3004 couples to module 3100, which in response to S3004 generates signals S202 comprised of frequency $f_{s1}$. Lead 3005 couples to module 3200 which receives signals S3005 and, in response thereto, generates signals S702 and S902 comprised of frequencies $f_{s2}$ and $f_{s3}$, respectively.

The selectable frequencies $f_{s1}$, $f_{s2}$, $f_{s3}$ are generated by modules 3000 and 3200 as multiples of 3.58 mHz. These multiples are designated as $N_1$–$N_6$ in FIG. 2. Some of the multiples are fixed, while other multiples are programmable. TABLE IV lists the selectable frequencies $f_{s1}$, $f_{s2}$, $f_{s3}$ along with the multiples $N_1$–$N_6$ and the intermediate clocking signals S3004 and S3005 as a function of the particular single sideband channel or AM channel that is to be received.

larly, frequency $f_{s2}$ equals 86,409 or 202,218 when multiplier $N_5$ equals 19,010 or 19,413, respectively.

Selectable frequency $f_{s3}$ is generated by appropriately choosing $N_6$. As illustrated in TABLE IV, frequency $f_{s3}$ is suitable for demodulating lower sideband channels when $N_6$ equals 235, and is suitable for demodulating upper sideband channels when multiplier $N_6$ equals 207.

As the preceding description pointed out, sideband signals may lie anywhere with their assigned 5-kHz channel, and thus it is desirable to control the selectable frequency $f_{s2}$ in fine increments. TABLE IV implies how this fine incremental control is obtained. Signal S3005 has a fixed frequency of 250 hertz and multiplier $N_4$ is fixed at 55. This produces a frequency of 250 Hz/55 or approximately 5 Hz. Thus, by constructing multiplier $N_5$ as a programmable multiplier, frequency $f_{s2}$ is controllable in increments of approximately 5 Hz.

Figure 5:
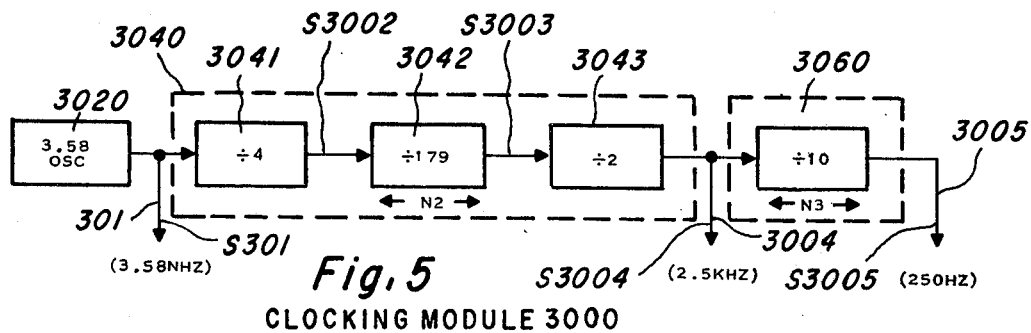
FIG. 5 is a detailed circuit diagram of a clocking module 3000 included within FIG. 2.
Figure 6:
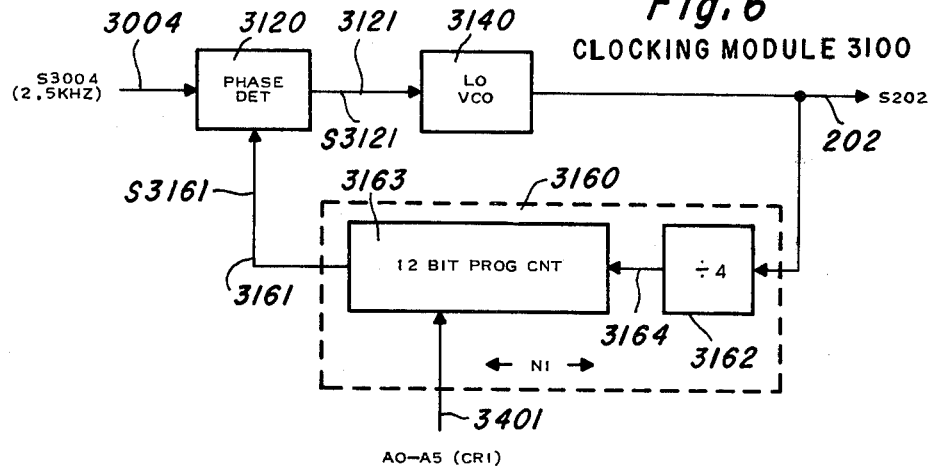
FIG. 6 is a are detailed circuit diagram of a clocking module 3100 included within FIG. 2.

FIGS. 5–7 illustrate the details of clocking modules 3000-3200. Referring first to FIG. 5, the details of clocking module 3000 are therein illustrated. Clocking module 3000 is comprised of a 3.58 mHz oscillator 3,020, a divided by $N_2$ logic circuit 3040 and divide by 10 logic circuit 3060. Each of the flip flops have their $\overline{Q}$ output coupled to their D input to thereby provide a divide-by-4 counter. Flip flops 3043 may be comprised of the commercially-available 74LS174, as an example.

FIG. 6 illustrates the circuit details of clocking module 3100. As illustrated in FIG. 6, clocking module 3100 is implemented by means of a phase lock loop. The phase lock loop is comprised of a phase detector 3120, a voltage controlled oscillator (VCO) 3140, and a programmable counter 3160. Phase detector 3120 has a first input coupled to lead 3004 and a second input coupled to an output of programmable counter 3160 via a lead

TABLE IV

| | SSB-CH | | | | AM-CH | |
|---|---|---|---|---|---|---|
| | 1L | 1U | 2L | 2U | 1 | 2 |
| osc | 3.58MHZ | | | | | →  |
| $f_{s1}$ | 23.84MHZ | 23.84MHZ | 23.85MHZ | 23.85MHZ | 23.84MHZ | 23.85MHZ |
| $N_2$ | 1432 | | | | | → |
| S3004 | 2.5KHZ | | | | | → |
| $N_1$ | 9,536 | | 9,540 | | 9,536 | 9,540 |
| $f_{s2}$ | 86,932HZ | 86,409HZ | 86,932HZ | 86,409HZ | 202,218HZ | |
| $N_3$ | 10 | | | | | → |
| S3005 | 250HZ | | | | | → |
| $N_4$ | 55 | | | | 24 | → |
| $N_5$ | 19,125 | 19,010 | 19,125 | 19,010 | 19,413 | 19,413 |
| $f_{s3}$ | 20,345HZ | 22,959HZ | 20,345HZ | 22,959HZ | H | H |
| $N_6$ | 235 | 207 | 235 | 207 | X | X |

Some of the information in TABLE IV can be correlated with the preceding description. Compare, for example, the $f_{s1}$ frequency listings of TABLE II, with the entries in TABLE IV. Also compare the TABLE III entries of $f_{s2}$, with the TABLE IV entries of $f_{s2}$. And further compare the demodulating clocking frequency $f_{s3}$ of FIGS. 3I and 3I1 with the $f_{s3}$ entries in TABLE IV.

Given the values of $f_{s1}$, $f_{s2}$ and $f_{s3}$ as listed in TABLE IV, $N_1$–$N_6$ must be chosen such that the desired frequencies are obtained. To this end, multiplier $N_2$ is chosen to be 1432. Thus, signal S3004 is a fixed frequency of 2.4 kHz. Accordingly, a selectable frequency $f_{s1}$ of 23.84 kHz is obtained by setting $N_1$ to 9,536 or 9,540, respectively.

As TABLE IV further illustrates, the multiplier $N_3$ is fixed at a value of 10. Thus, signal S3005 is a fixed frequency of 250 Hz. And therefore, selectable frequency $f_{s2}$ becomes 86,932 (as required to receive lower sideband signals) when multiplier $N_5$ equals 19,125. Simi-

3161. A lead 3121 couples an output of phase detector 3120 to an input of VCO 3140. Lead 202 couples an output of VCO 3140 to an input of counter 3160 thereby completing the phase locked loop.

Note that the clocking means herein described utilizes only a single reference frequency (single crystal oscillator) from which all of the mixing frequencies and modulating frequencies are derived. This clocking means may also be utilized in transceivers which perform the sideband filtering with crystal filters. Such a crystal filter is described, for example, in the *Radio Amateur's Handbook* on pages 414–419, published by the American Radio Relay Leaque in 1976. The crystal filter therein described would replace charge coupled device filter 700, and the frequency shifting performed by filter 700 would be performed by altering frequencies $f_{s1}$, $f_{s3}$, or by adding an additional mixer.

Figure 7A:
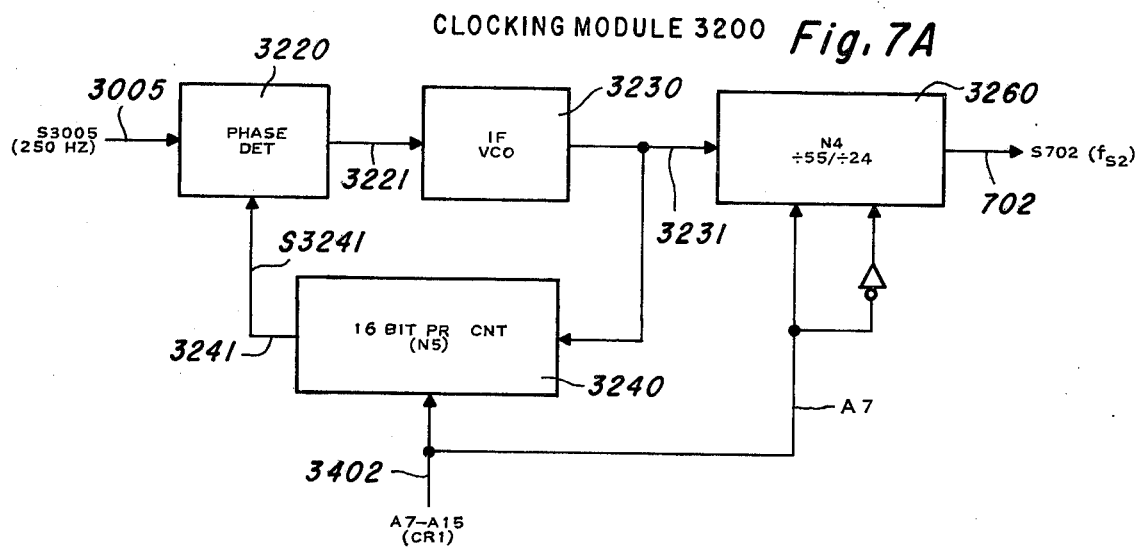

A block diagram of clocking module 3200 is illustrated in FIG. 7A. As therein illustrated, the N5 factor is implemented by means of a phase lock loop. This loop is similar in structure to the phase lock loop which was utilized to implement the N1 factor as described in FIG. 6. The phase lock loop in FIG. 7 is comprised of a phase detector 3220, a VCO 3230, and a 16-bit programmable counter 3240. Phase detector 3220 has a first signal input coupled to lead 3005 for receiving signals having reference frequency of 250 Hz, and a second input coupled to lead 3241 for receiving signals generated by counter 3240. The output of phase detector 3220 is coupled via a lead 3221 to an input of VCO 3230. A lead 3231 couples an output of VCO 3230 to an input of counter 3240, thereby completing the loop.

FIG. 7B illustrates the details of the divide-by-N6 counter which is utilized to generate the third selectable frequency $f_{s3}$. As therein illustrated, the divide N6 counter 3280 is similar in construction to the previously-described counters. That is, it is comprised of two, four-bit up counters 3285 and 3286 which are identical to the previously-described counters 3044 and 3045. The data inputs of these counters are selectively set to be the ones complement of 235 when the logic signal A6 is high, and the ones complement of 207 when the logic signal A6 is low. A logic gate 3288 couples to lead 902, and the logic signal S902 comprised of the third selectable frequency $f_{s3}$ is generated thereon.

Figure 8:
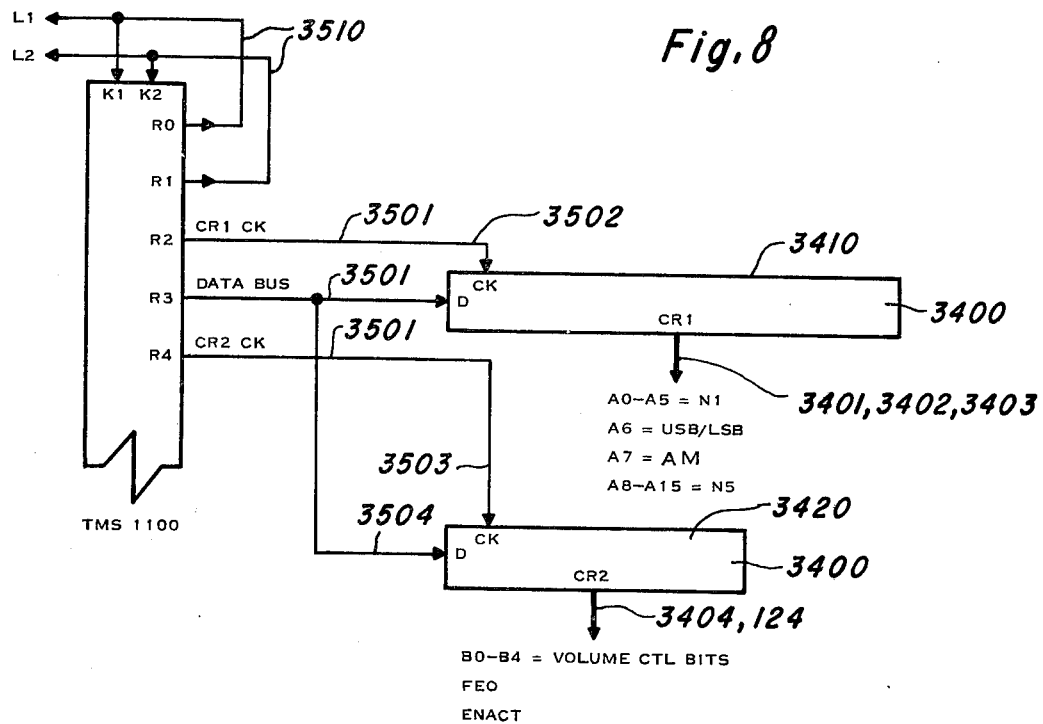
FIG. 8 is a circuit diagram illustrating the source of logic signals which are utilized by clocking modules 3000-3200 of FIGS. 5-7.

Referring now to FIG. 8, the source of the logic signals which are generated to specify the value of multipliers N1, N4, N5, and N6, and to operate volume control unit 1000 is therein illustrated. The source of these logic signals includes two logic registers 3400. One of the registers 3410 is a 16-bit register, and it has outputs coupled to leads 3401, 3402, and 3403. Output bits 0–6 of register 3410 are coupled to lead 3401 and signals A0–A6 are generated thereon. Output bits 7–15 of register 3410 are coupled to leads 3402 and signals A7–A15 are generated thereon. Output 3410 is coupled to lead 3403 to generate signal A6.

The second register 3420 is a seven-bit register. It has output bits 0–4 coupled to leads 3404 to thereby provide the volume control logic signal B0–B4. Bit 5 of register 3240 is coupled to lead 124 to provide previously-described logic signal FE0. Bit 6 of register 3240 provides a logic signal ENACT (enable auto call transmit) the function of which is described later in conjunction with transmit.

Registers 3410 and 3420 are comprised of D-type flip flops. A microprocessor 3500 is utilized to provide data and clocking input signals for both of these registers over leads 3501. This data constitutes microcommands which are interpreted and responded to by circuits coupled to the register outputs. In one embodiment, microprocessor 3500 is comprised of a TMS1100 which is manufactured by Texas Instruments Incorporated. Details of the TMS1100 are given in the publication entitled, "Programmers Reference Manual for the TMS 1000 Series MOS/LSI One-Chip Microcomputers." The publication is published and made available through Texas Instruments Incorporated. See also U.S. Pat. No. 3,991,305, by inventors Caudel et al. assigned to Texas Instruments Incorporated.

The TMS1100 includes an 11-bit output register having bits labeled R0–R10. As illustrated in FIG. 8, bit R2 is coupled to the clocking input of register 3410 via a lead 3502, and a clocking signal CR1CK is generated thereon. Similarly, bit R4 is coupled to the clocking input of register 3420 via a lead 3503, and a clocking signal CR2CK is generated thereon. Bit R3 is coupled to the data inputs of registers 3410 and 3420 via lead 3504, and a data signal called DATABUS is generated thereon.

The TMS1100 also includes a 4 bit input register having inputs K1, K2, K4, and K8. Inputs K1 and K2 are coupled to control unit 40 via leads 3510 to provide a means by which microprocessor 3500 receives control signals L1 and L2 from the control unit. In response to signals L1 and L2, microprocessor 3500 generates the logic signals CR1CK, CR2CK, and DATABUS to thereby specify the appropriate multipliers N1–N6 and the appropriate volume control bits. Signals L1 and L2 are described infra.

Several modifications to the above-described receive circuitry of the transceiver of FIG. 2 may be made without departing from the inventive concepts disclosed therein. For example, a microprocessor other than the TMS1100 may be utilized to receive control signals via leads 3510 and in response thereto to generate data and clocking signals for registers 3400. A TMS1000 or a TMS1200 may be utilized to replace the TMS1100 as an example. In addition, the counters comprising clocking modules 3000–3200 may be implemented with circuits other than those illustrated in FIGS. 5–8. For example, the programmable counters may be implemented with down-counters rather than up-counters, in which case the actual number to be counted, rather than its complement, would be applied to the data inputs of the counter. Further, CCD filter 700 may be constructed to have passbands centered about the frequencies $nf_{s2} \pm kf_{s2}$ where k is not equal to $\frac{1}{4}$. For example, k could equal $\frac{1}{8}$, in which case the values of N1–N6 would be scaled appropriately.

Figure 9:
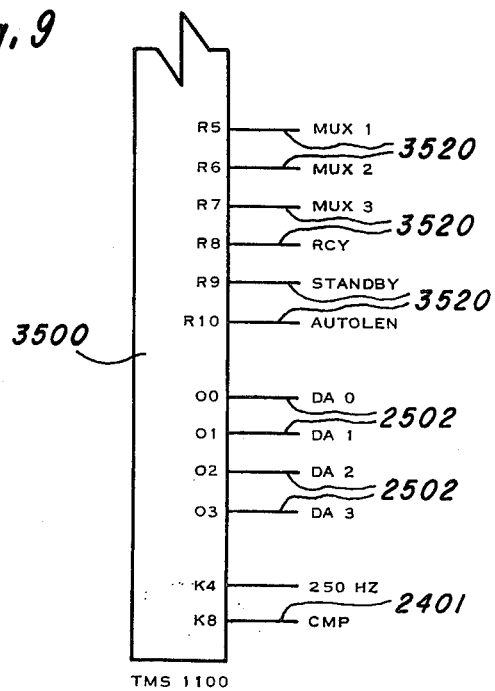
FIG. 9 is a block diagram of a micro computer which forms a portion of the circuit of FIG. 8.

Referring now to FIG. 9 a block diagram of that portion of the TMS1100 which was not included in FIG. 9 is therein illustrated. Input register bit K4 is coupled to receive a logic signal 250Hz, and input register bit K8 is coupled to receive a logic signal CMP. Further, output bits R5–R10 are the source of logic signals MUX1, MUX2, MUX3, RCV, STANDBY and AUTOLEN, respectively. These signals are microcommands to the circuits which receive them. Signal RCV is utilized to control switch 600 as was illustrated in FIG. 4f. In addition, the TMS100 has a second output register having output bits 00, 01, 02, and 03 which generate logic signals (microcommands), DA0, DA1, DA2, and DA3, respectively. The function of each of the above microcommands is described below.

The transceiver of FIG. 2 includes means for performing a squelch operation. The squelch operation functions during a receive mode to inhibit signals S9 from passing through volume control unit 1000 whenever signal S9 contains no information. The presence or absence of information in signal S9 is indicated by the amplitude of the signal. When the amplitude of signal S9 is relatively small, volume control unit 1000 is disabled by setting signal B4 on lead 3404 to a high voltage. Conversely, volume control unit 1000 is enabled by setting signal B4 to a low voltage when signal S9 has a relatively high amplitude.

Referring back to FIG. 2, the circuit components which are utilized to implement the squelch function are therein illustrated. These components include an AGC detector 2100 having an input coupled to lead 801 for receiving signal S9. In response to signal S9, AGC detector 2100 generates an analog signal AGC on a lead 2101. Signal AGC has an amplitude proportional to the time average amplitude of signal S9. Lead 2101 couples to the input of a scaling circuit 2200. An output of scaling circuit 2200 is coupled via a lead 2201 to an analog multiplexer 2300. Multiplexer 2300 has an output coupled to a lead 2301, and analog signals CMP1 are generated thereon. Lead 2301 couples to the input of an analog comparator 2400. Comparator 2400 has an output coupled via a lead 2401 to the K8 input of TMS1100 microprocessor 3500. Comparator 2400 has a second input which is coupled to the output of a digital-to-analog converter 2500 via a lead 2501. Converter 2500 generates analog signals CMP2 on lead 2501. The TMS 1100 microprocessor generated signals DA0–DA4 are coupled via leads 2502 to inputs of converter 2500.

FIGS. 10A–10D are detailed circuit diagrams of components 2100–2500, and FIG. 10E is a timing diagram illustrating their operation. Referring first to FIG. 10A, a detailed circuit diagram of AGC detector 2100 is therein illustrated. Basically, AGC detector 2100 is comprised of an operational amplifier 2120 having an input circuit 2121 and a feedback circuit 2123. Input circuit 2121 includes a diode 2122 having an input coupled to lead 801 for receiving signal S9. Diode 2122 operates to rectify signal S9, and feedback network 2123 operates to form the time average of the rectified signal. Amplifier 2120 has an output coupled to lead 2101; and signal AGC, which represents the time average of the rectified S9 signal, is generated thereon. FIG. 10E illustrates an example of signals S9 and SGC.

A detailed circuit diagram of AGC scaling circuit 2200 is illustrated in FIG. 10B. The circuit is comprised of an operational amplifier 2220 having an input resistor 2221 and a feedback resistor 2222. Resistors 2221 and 222 provide a scaling factor of one fifth. Signal AGC is coupled through resistor 2221 to a negative input of amplifier 2220. Lead 2201 couples to the output of amplifier 2220.

FIG. 10C is a detailed circuit diagram of analog multiplexer 2300. Multiplexer 2300 is comprised of two, logically controlled switches, 2320 and 2321. Logic signals MUX1, MUX2, MUX3, and AUTOLEN, which are generated by a microprocessor 3500 on leads 3520, are utilized to logically control switches 2320 and 2321. FIG. 10C includes a truth table which lists the input signal that is passed by multiplexer 2300 as a function of the logical control signals. Each of the input signals therein listed is described in the following portions of this description. An output signal CMP1 of multiplexer 2300 is generated on lead 2301.

FIG. 10D is a detailed circuit diagram of comparator 2400 and digital-to-analog converter 2500. Comparator 2400 includes an operational amplifier 2420. Amplifier 2420 has an input coupled to receive signal CMP1 through a 10-K resistor 2421, and the same input is coupled to receive signal CMP2 through a 51-K resistor 2422. Amplifier 2420 has a second input coupled to ground, and has no feedback circuitry. Therefore, its output, which couples to lead 2401, switches between a high and low voltage level dependent upon whether or not signal CMP1 is greater or less than signal CMP2.

Digital-to-analog converter 2500 is comprised of an operational amplifier 2520 having a resistive feedback network 2521 and a resistive input network 2522. Therefore, amplifier 2520 acts as a summer. Signals DA0–DA3 are selectively coupled to the input of resistors 2522 via leads 2502 to thereby provide a digitally-controllable input to the summer. Microprocessor 3500 operates to set the logical states of DA0–DA3 in response to signals L1 and L2 received from control unit 40. These signals are initiated by manual operation of the control unit.

The operation of the above-described squelch apparatus is illustrated in FIG. 10E. During a first time interval, T1, signal S9 has a relatively low average amplitude. That is, signal SAGC is less than signal CMP2. As a result, signal CMP is at a low voltage level. Microprocessor 3500 samples signal CMP at intermittent intervals during the receive mode of operation, and disables volume control unit 1000 in response to signal CMP being at a low voltage level. During a second time interval, T2, the amplitude of signal S9 greatly increases indicating the presence of speech or other information therein. In response, singal SAGC increased to a level greater than the magnitude of signal CMP2, which results in signal CMP switching to a high voltage level. Microprocessor 3500 intermittently samples signal CMP, and in response to its high voltage level, enables volume control unit 1000 to permit the information present in a signal S9 to be converted into audible sounds.

The squelch circuitry is also used by the transceiver to perform a clear channel function and a busy channel function. Both functions are manually activated via control lead 40 as is described infra. Microprocessor 3500 receives signals via leads 3510 indicating the operations to be performed. In response thereto, processor 3500 stores the channel it is presently operating on in its memory. Then it sequentially steps through adjacent channels by varying frequencies $f_{s1}$ and $f_{s2}$. Processor 3500 monitors signal CMP for each channel stepped through and sends messages to processor 3600 indicating its state. When a clear channel or busy channel is found as the function requests, processor 3600 indicates that channel to the operator via display 3800. Then processor 3500 reselects the previously used channel.

Figure 11:
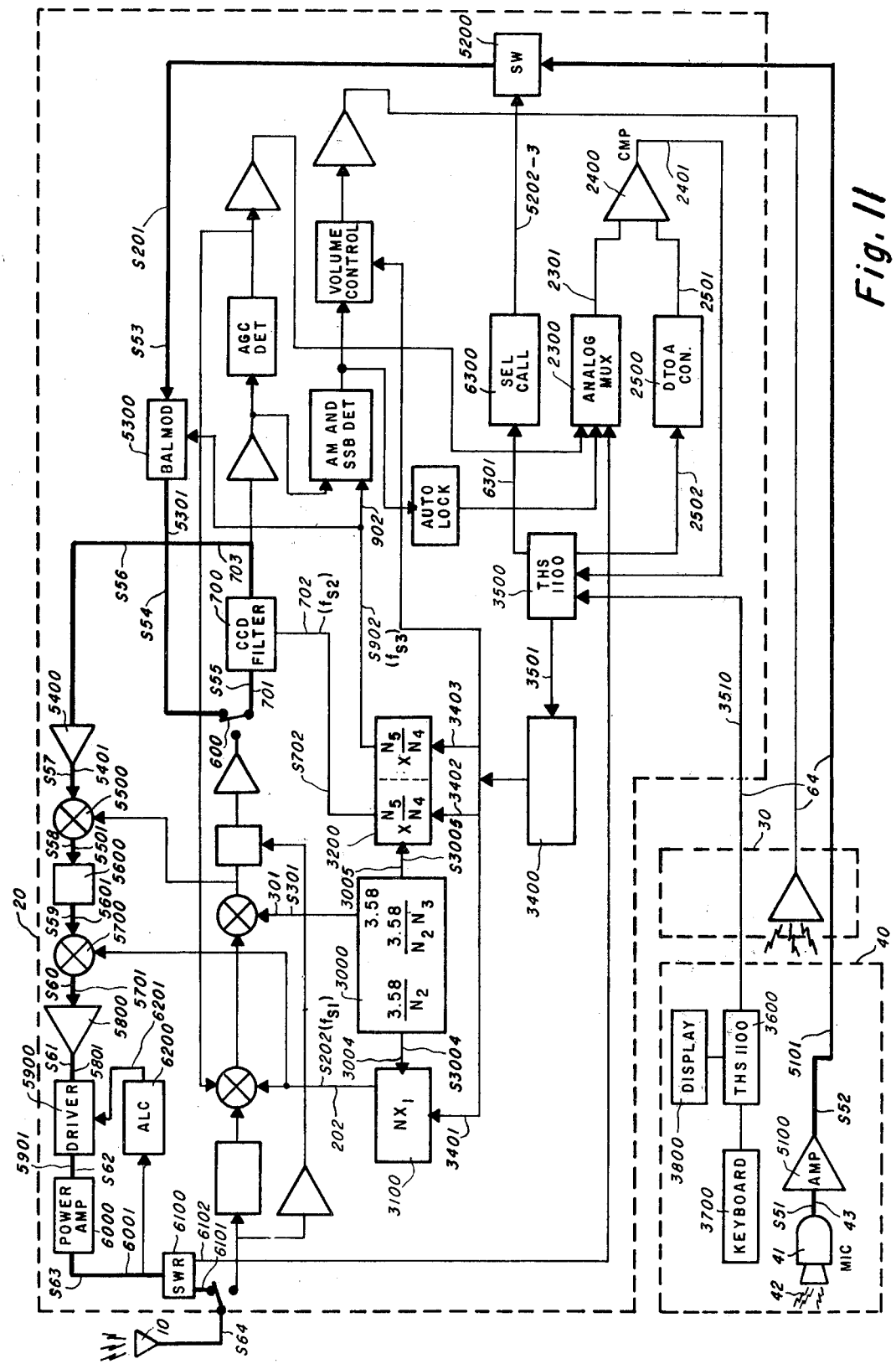
FIG. 11 is a circuit diagram identical to FIG. 2 with the exception that the transmit signal path components are emphasized rather than the receive signal path components.
Figure 14:
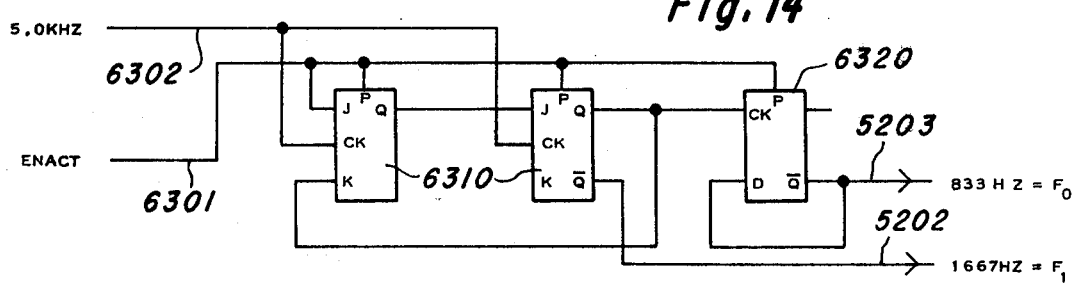
FIG. 14 is a logic diagram of the selective call unit included within the transceiver of FIG. 11.

The operation of the transceiver of FIG. 1, while it is in the transmit mode, will now be described in conjunction with FIGS. 11 and 12. FIG. 11 is identical to the previously described FIG. 2, except that FIG. 11 contains reference numerals identifying those components of the transceiver which are utilized in a transmit mode, whereas FIG. 2 contains reference numerals identifying those components used in the receive mode. Also, in FIG. 11, the transmit signal path is emphasized by a thickened line, whereas in FIG. 2, the receive signal path is emphasized by a thickened line. Signals S51–S64 are generated at various points on the transmit signal path as indicated in FIG. 14.

Microphone 41 is the first component included within the transmit signal path. Microphone 41 receives sound waves 42, and in response thereto, generates electronic signals S51 on a lead 43. Lead 43 couples to the input of an audio amplifier 5100. Amplifier 5100 has an output coupled via a lead 5101 to a switch 5200, and signals S52 are generated thereon by amplifier 5100.

When speech is being transmitted, switch 5200 passes signals S52 to its output. Signals S53 at the output of switch 5200 are coupled via lead 5201 to the signal input of a balanced modulator 5300. Modulator 5300 also has a clocking input which is coupled to lead 902 for receiving signals S902 (which contain the third selectable frequency $f_{s3}$). Modulator 5300 has an output coupled via a lead 5301 to switch 600, and signals S54 are generated thereon. Signals S54 are double sideband signals in the sideband mode of operation, and are amplitude modulated signals in the AM mode of operation. That is, the carrier frequency, which equals multiples of the third selectable frequency $f_{s3}$, is inserted into signal S54 only in the AM mode of operation by modulator 5300.

Modulator 5300 generates signals S54 by sampling signals S53 at a frequency $f_{s3}$ of approximately 22 kHz. Diagrams 12B and 12C illustrate the effect of this sampling operation on two different frequency scales. As therein illustrated, signal S54 is comprised of a plurality of identical frequency spectrums, each of which is centered about a multiple of frequency $f_{s3}$. The center of the 21st frequency spectrum lies at 455 kHz. Thus, the lower sideband portion of the 21st spectrum is centered at approximately 450 kHz, and the upper sideband portion of the 21st spectrum is centered at approximately 460 kHz.

In the transmit mode, filter 700 is coupled to receive signal S54 through switch 600. The function of filter 700 is to selectively filter either the lower sideband, the upper sideband, or the AM signal which lies nearest to 455 kHz. Thus, dependent upon the mode of operation, the clocking frequency $f_{s2}$ of filter 700 is selectively chosen as designated in TABLE V such that the desired filtering is performed. Diagram 12D illustrates the passbands of filter 700 when it is clocked to pass only the lower sideband. As was the case for the previously-described read mode of operation, the 11th passband of filter 700 is used to filter sidebands from an input signal; whereas, the fifth passband of filter 700 is used to filter an AM band from an input signal.

The output of filter 700 generates signals S56. Signals 56 are coupled via a lead 703 to a tuned amplifier 5400. Amplifier 5400 is tuned to 455 kHz. Amplifier 5400 has an output lead 5401 and signals S57 are generated thereon. Diagrams 12E and 12F illustrate signals S56 and S57 in the frequency domain. As therein illustrated, signal S56 includes a plurality of filtered frequency bands; whereas, signal S57 includes only that band which is nearest to 455 kHz.

TABLE V

| $f_{s2}$ | MODE |
|---|---|
| 86,409 Hz | USB |
| 86,932 Hz | LSB |
| 202,218 Hz | AM |

Lead 5401 couples to the input of a mixer 5500. Mixer 5500 has a clocking input which is coupled to a lead 301 for receiving signals S301 thereon. Signal S301 includes a fixed 3.58-mHz frequency, and it is generated as described supra. Mixer 5500 has an output coupled to a lead 5501, and signals S58 are generated thereon. Signals S58 equal signals S57 frequency shifted to 3.58 mHz ±455 kHz.

Lead 5501 couples to the input of the filter 5600. Filter 5600 is tuned to only pass frequencies near 3.125 mHz. The output of filter 5600 is coupled to a lead 5601, and signals S59 are generated thereon. Diagram 12I illustrates signals S59 in the frequency domain.

Lead 5601 couples to the input of a mixer 5700. Mixer 5700 has a clocking input which couples to lead 202 for receiving signals S202. Signals S202 are generated as previously described and contain the first selectable frequency $f_{s1}$. Frequency $f_{s1}$ is selectively chosen such that the sum of $f_{s1}$ + 3.125 mHz equals the center frequency of the channel on which signals S51 are to be broadcast. Mixer 5700 has an output coupled to a lead 5701, and signals S60 are generated thereon. Signals S60 equal signals S59 frequency shifted to $f_{s1}$ ±3.125 mHz is indicated in FIG. 12J.

An amplifier 5800 is coupled to receive signal S60, and to tune out the lower band of frequencies. Diagram 12K illustrates the frequency spectrum of signal S61.

Signal S61 is serially coupled to the antenna 10 through a driver circuit 5900, a power amplifier 6000, and a standing wave ratio measuring circuit 6100. Signals S62, S63, and S64 are generated by these circuits, respectively. Driver 5900 and power amplifier 6000 modify the amplitude of signal S61, but not the frequencies contained therein. Thus, signal S64, which is transmitted by antenna 10, has the same frequency spectrum as signals S61, as illustrated in Diagram 12K.

Figure 13A:
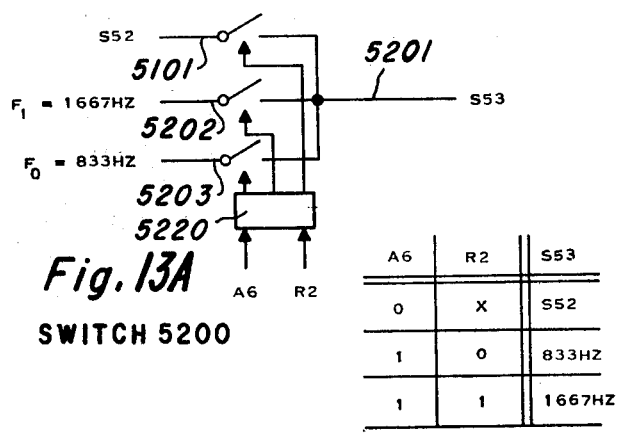
FIG. 13A-13D are detailed circuit diagrams of components comprising the transmit signal path of FIG. 11.

FIG. 13A is a functional schematic of switch 5200. Switch 5200 has three signal inputs coupled to leads 5101, 5202 and 5203 for receiving signals S52, $f_0$, and $f_1$, respectively. A logic enabling network 5220 is provided for receiving signals A6 and R2. Signals A6 and R2 logically pass one of the three input signals through switch 5200. FIG. 13A includes a truth table indicating this logical operation.

Signals S54 couples to an input of switch 600 which, in turn, couples to CCD filter 700.

Figure 13B:
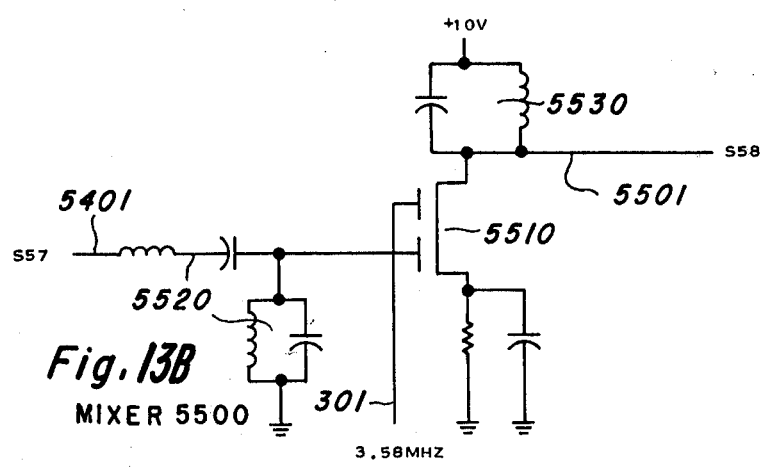

Signal S57 couples to mixer 5500 as illustrated in FIG. 13B. Mixer 5500 is constructed similar to mixer 300 which is illustrated in the previously-described FIG. 4C. Mixer 5500 includes a dual-gate FET 5510. One of the gates is coupled to receive signal S57 through a filter 5520 which has a resonant frequency of 455 kHz. The other gate of FET 5510 couples to lead 301 for receiving the 3.58 mHz frequency. Mixer 5500 further includes a tank circuit 5530 having a resonant frequency of 3.125 mHz. The output of tank circuit 5530 couples via lead 5501 to the source of FET 5510 where signal S58 is generated.

Figure 13C:
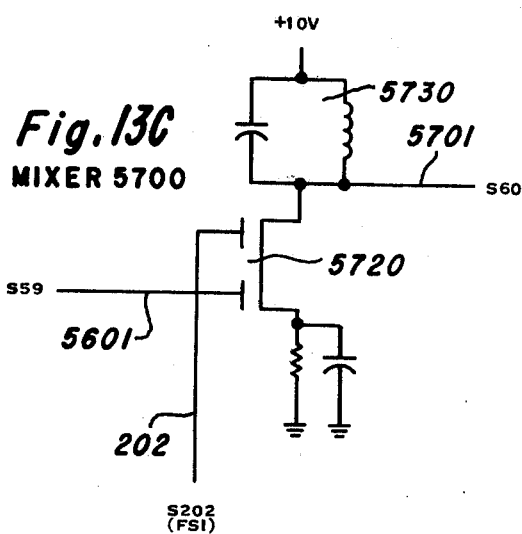

A detailed circuit diagram of mixer 5700 is provided by FIG. 13C. Mixer 5700 is similar in construction to the previously described mixer 200 of FIG. 4B. Mixer 5700 includes a dual-gate FET 5720. One of the gates is coupled to receive signal S59, and the other gate is coupled to receive signal S202 containing the first selectable frequency $f_{s1}$. A tank circuit 5630 having a resonant frequency of approximately 27 mHz has an output coupled to the source of FET 5720. Signals S60 are generated at the source of FET 5720.

Figure 13D:
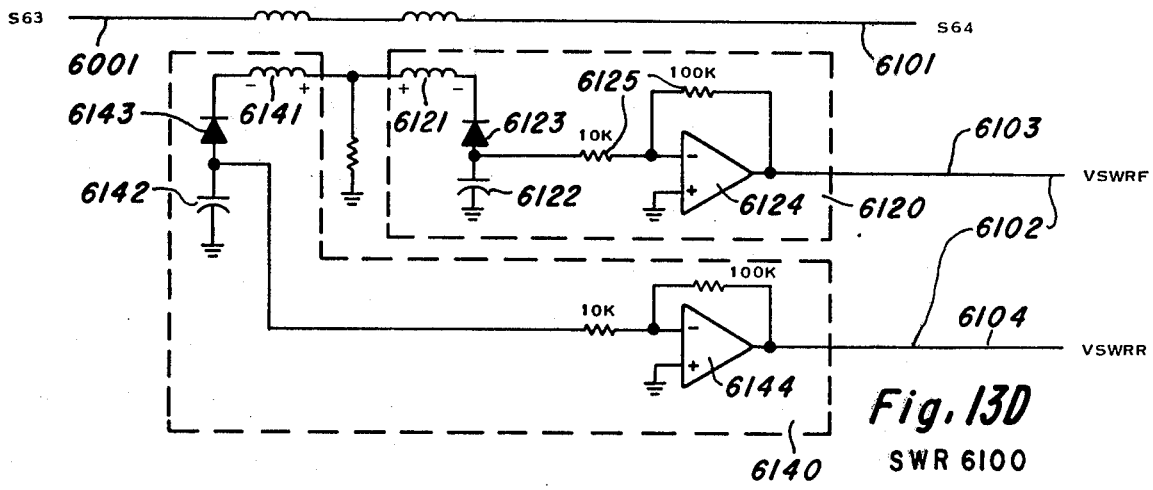

Signal S63 is inductively coupled via lead 6001 to the standing wave ratio measuring circuit 6100, as illustrated in FIG. 13D. Standing wave ratio circuit 6100 is comprised of a forward wave-measuring circuit 6120 and a reverse wave-measuring circuit 6140. Circuit 6120 includes an inductor 6121 which is serially coupled to a capacitor 6122 through a diode 6123. Signal S63 induces voltages across inductor 6121. Diode 6123 enables the induced voltage to generate a current through capacitor 6122 only when the inducted voltage is in response to a forward wave on lead 6001. Circuit 6120 further includes an operational amplifier 6124 having an input coupled to receive the voltage across capacitor 6122. Input and feedback resistors 6125 are provided to give operational amplifier 6124 a gain of approximately 10. The output of operational amplifier 6124 couples to a lead 6003, and signals VSWRF are generated thereon.

Circuit 6140 has a structure similar to that of circuit 6120. Circuit 6140 includes an inductor 6141, serially coupled to a capacitor 6142 through a diode 6143. A voltage is induced across inductor 6141 by signals S63, and diode 6143 permits current to flow through capacitor 6142 in response to the induced voltage whenever the induced voltage is due to a reflected wave within signal S63. An operational amplifier 6144 amplifies the voltage across capacitor 6142 by a factor of approximately 10 and generates output signals VSWRR on a lead 6004.

Signals VSWRF and VSWRR are coupled via leads 6003 and 6004 to analog multiplexer 2300, as was previously described in conjunction with FIG. 10C. Microprocessor 3500 selectively measures the voltage of signals VSWRF and VSWRR by means of digital-to-analog converter 2500 and comparator 2400. Under normal operational conditions, signal VSWRF is much larger than signal VSWRR. Conversely, under abnormal conditions, signal VSWRR approaches or exceeds the magnitude of signal VSWRF. An abnormal condition may be the result of a damaged antenna 10, as an example. In the transmit mode, microprocessor 3500 intermittently transmits a 1667-Hz signal for short time intervals via a selective call unit 6300 (described infra) and measures the ratio of signals VSWRF and VSWRR by utilizing the above-described circuits. Microprocessor 3500 then indicates a failure condition to the operator if the standing wave ratio exceeds 4.0.

The transceiver of FIG. 11 further includes means for performing a selective call operation. To perform a selective call operation, a receiving transceiver is assigned a call number. The call number consists of a sequence of five digits. Subsequently, a transmitting transceiver transmits the call number; and in response thereto, the receiving transceiver senses the transmitted call number as being the one which it was assigned. In response to the sensing of its call number, the receiving transceiver performs a preprogrammed operation (e.g., the microprocessor in the receiving transceiver turns the volume on).

FIG. 14 is a logic diagram of a selective call unit 6300 which is included in the transceiver of FIG. 11. Call unit 6300 is comprised of two J-K flip-flops 6310 and a D flip-flop 6320. The J-K flip-flops are intercoupled to form a divide-by-three counter, while the D flip-flop is intercoupled to form a divide-by-two counter. A logic signal ENACT generated by a microprocessor 3500 is coupled via a lead 6301 to enable counters 6310 and 6320; and a clocking signal having a fixed frequency of 5.0 kHz is coupled via a lead 6302 to clocking inputs of flip-flops 6310. In response thereto, a signal f1 of 1667 Hz and a signal f0 of 833 Hz are generated on leads 5202 and 5203 respectively. Leads 5202 and 5203 couple to the input of switch 5200 as was previously described in conjunction with FIG. 13A. The output of switch 5200 is logically controlled by a microprocessor 3500 via logic signals A6 and R2.

The above-described configuration provides a means for transmitting a binary coded selective call number. Each digit of the selective call number is represented by a sequence of four binary bits. A "0" bit is represented by 833 Hz, while a "1" is represented by 1667 Hz. The "1" and "0" frequency assignments may also be reversed as an alternative. Each bit comprising the call number is transmitted for one bit period. The bit period equals 32 ms in one embodiment. The actual transmission of a call number is manually activated via control unit 40, as is described infra.

The receiving transceiver utilizes the previously-described autolock logic 2600 for recognizing when its assigned unit number is transmitted. The receiving transceiver first monitors the SAGC signal to determine the presence of signal. Then it enables its autologic. Once enabled, the AL signal reflects a count of either 833 Hz or 1667 Hz for each bit that is transmitted. Microprocessor 3500, in the receiving transceiver, reads signal AL and compares the bit sequence to its assigned unit number. When the received call number and the assigned call number are equal, the receiving transceiver is activated.

The apparatus described above for performing a digital selective call is also capable of assigning different call numbers to several channels. That is, keyboard 3700 in control head 40 is utilized to send a plurality of call numbers and associated channels to processor 3500. Processor 3500 stores the call numbers in its memory; and selectively reads the call numbers for comparison with a transmitted call number dependent upon which channel it was being operated on at a particular time period.

Additionally, the apparatus described above may be utilized to transmit digital selective call numbers plus subsequent digital control messages. The digital messages are specified by the operator utilizing keyboard 3700 in a manner similar to that used to select a particular call number. The digital control message is received by processor 3500 via leads 3510. In response thereto, processor 3500 sends microcommands to switch 5200 to thereby couple the 1 and 0 frequencies to the antenna in a manner which indicates the bits of the digital control message. The receiving transceiver utilizes the autolock logic 2600 for receiving the digital control message in the same manner that it is utilized to receive a selective call number. Processor 3500 of the receiving unit interprets the digital control message and generates microcommands in response thereto for implementing the digitally-coded function. For example, such digital control messages could be utilized to remotely control stereos, televisions, or home lighting.

Figure 15:
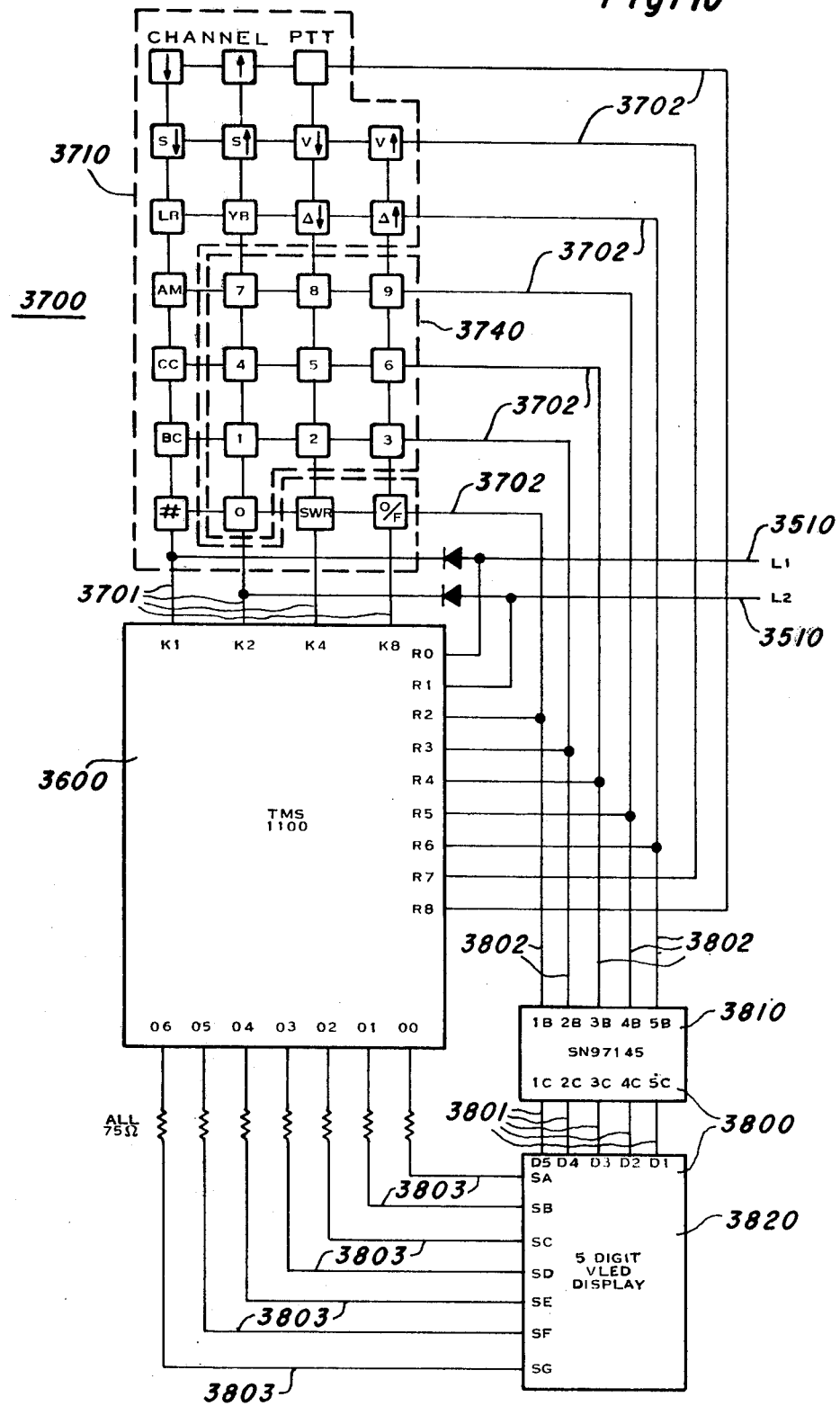
FIG. 15 is a detailed schematic diagram of the control unit included within FIGS. 1, 2, and 11.

The means for manually operating the transceiver of FIG. 11 (and the transceiver of FIG. 2) will now be described in conjunction with FIG. 15. FIG. 15 is a detailed schematic diagram of keyboard 3700, display 3800, and microprocessor 3600, all of which are included within control head 40. In general, each operation which the transceiver performs is initiated via keyboard 3700.

Keyboard 3700 includes a plurality of control keys 3710 and a plurality of digit keys 3740. Control keys 3710 include a C ↑ key and a C ↓ key for incrementing the channel up or down respectively. Also, an S ↑ key and an S ↓ key is provided for modifying the squelch setting upward or downward respectively. Similarly, a V ↑ key and a V ↓ key is provided for turning the volume up or down, respectively. And a Δ ↑ key and a Δ ↓ key are provided for moving the clarifying frequency (i.e., $F_{s2}$) up or down respectively while receiving sideband signals.

Keyboard 3700 further includes keys LB, UB, and AM for selecting lower sideband, upper sideband or AM mode of operation, respectively. Also a CC key is provided for enabling the clear channel function, while a BC key is provided for enabling the busy channel function. A # key is provided for assigning a call number to the transceiver, and for enabling the transceiver to transmit a call number. A SWR key is provided for reading out the standing wave ratio. An O/F key is provided for enabling or disenabling the transceiver. And a PTT key (push to talk) is provided for enabling the transmit mode of operation.

Additionally, digit keys 3740 are provided for use in conjunction with various of the above-described control keys. for example, digit keys 2740 are used in conjunction with the LB key, UB key, and AM key for selecting a channel and mode of operation simultaneously. The actual sequence in which keys 3740 and keys 3710 are used to activate the various functions is listed in TABLE VI which will be described shortly.

Keyboard 3700 couples via leads 3701 and 3702 to microprocessor 3600 and is sensed thereby. Leads 3701 couple to the K register inputs of processor 2600, whereas leads 3702 couple to the R register outputs of microprocessor 3600. Thus, the state of any key within keyboard 3700 is sensed by microprocessor 3600 by selectively setting bits in register R, and by sensing for a return signal in register K.

Display 3800 also couples to microprocessor 3600 and is controlled thereby. Display 3800 is comprised of a 5-digit LED display 3820 and a digit driver circuit 3810. Leads 3801 couple the output of driver circuit 3810 to the digit inputs of display 3820; while leads 3802 couple the input to driver circuit 3810 to the output of register R of microprocessor 3600. The output of register O of microprocessor 3600 is coupled via leads 3803 to the segment inputs of LED display 3820. Thus, the state of the 5-digit display 3820 is controlled by microprocessor 3600 via its register R and O.

Microprocessor 3600 is further coupled via lead 3510 to microprocessor 3500. Leads 3510 provide the means whereby messages are sent between microprocessors 3500 and 3600. The manner in which these messages are transmitted is illustrated in FIGS. 16A-16C. FIG. 16A is a timing diagram illustrating a message being sent from microprocessor 3600 to microprocessor 3500. As the timing diagram indicates, microprocessor 3600 is a master unit, whereas microprocessor 3500 is a slave unit. That is, all the messages are initiated by processor 3600, and only answer-back messages are given by processor 3500.

At a time T1, signals L1 and L2 are both low. This is the quiescent state of L1 and L2. At a second time instant T2 the master processor raises signal L1 to a high voltage level. In response thereto, at a time T3, the slave processor raises signal L2 to a high voltage level. The high voltage level on signal L2 indicates to the master processor that the slave is ready to receive a transmitted message.

In order for the master to transmit one bit, the following sequence occurs. At a time T4, the master forces the voltage of L2 to a low value. Subsequently, the master forces the voltage of L1 to equal the voltage of the transmitted bit. Next, the master forces the voltage of signal L2 to a high state. Then, after a period of approximately 5 msec, the master forces the voltage of signal L2 to a low state. At a time T5 while signal L2 is in a low state, the master then changes the voltage of signal L1 to equal that of the next bit to be transmitted. Signals L1 and L2 are sequenced in a T4-T5 manner for each bit that is transmitted.

FIG. 16B is a timing diagram illustrating how messages are sent from the slave to the master processor. At a time T10, after the master has sent its message, the voltage of signals L1 and L2 are in the quiescent state. At a time T11, the slave sets the voltage of signal L1 to equal the bit which it desires to transmit. Subsequently, the slave sets signal L2 to a high voltage level. The high voltage level is maintained on signal L2 for approximately 5 msec. Subsequently, signal L2 is set by the slave to a low voltage level. And then, at a time T12, the slave changes the voltage level on signal L1 to equal the next bit to be transmitted. The T10-T12 sequence of signals on L1 and L2 is repeated by the slave for each bit which the slave transmits.

All messages which are transmitted by the master or by the slave processor on leads 3510 have a format as indicated in FIG. 16C. As therein indicated, each message consists of an ID digit, followed by message digits M1-M5, followed by a check digit C. Each of the digits is comprised of four bits. The ID digit indicates the general nature of the message. The message digits indicate the specific details of the message. And the check digit is generated as a function of the ID digit and the M1-M5 digits. For example, in one embodiment, it equals the sum of the "1" bits in the ID digit and M1-M5 digits.

Table VI lists several functions which the transceiver of FIGS. 2 and 11 perform, and indicates which keys of keyboard 3700 and which messages between the master and slave are utilized to implement each function. For example, the first entry in TABLE VI indicates how to select a particular channel and mode. First, two of the digit keys are depressed to indicate the desired channel. Next, either an AM key, an LB key, or a UB key is depressed dependent upon the desired mode of operation. Microprocessor 3600 responds to the above key sequence by sending a message to the slave processor 3500 as indicated in TABLE VI. That is, the master sends an ID digit of D, an M1 and M2 digit indicating a channel number, the M3 digit indicating the mode of operation, and M4 and M5 digits which are "don't care's". A check digit C is also sent. In response thereto, microprocessor 3500 sends an ID digit of C, an M1 and M2 digit indicating the channel number requested, an M3 digit indicating the requested mode of operation, an M4 digit indicating the signal strength on the requested channel, and an M5 digit indicating status of the analog signal processor. The check digit C is also sent. The slave processor 3500 also performs the requested operations by utilizing the clocking means 3000, 3100, 3200, and the other logically-controllable means as was previously described.

TABLE VI

SELECT CHANNEL & MODE

KEY SEQ. = Most Sig. CH. Number, Least Sig.
    CH. Number, mode Key (e.g., AM/LB/UB)

L1, L2 MESSAGE SEQUENCE:

| 1-MASTER = D | channel number | channel number | Mode | Φ | Φ | C |
|---|---|---|---|---|---|---|
| 2-SLAVE = C | channel number | channel number | Mode | signal strength | status | C |

VOLUME CHANGE

KEY SEQ. = V↓ or V↑
L1, L2 MESSAGE SEQUENCE:

| 1-MASTER = A | Φ | Φ | Φ | Φ | Φ | C |
|---|---|---|---|---|---|---|
| 2-SLAVE = A | volume | squelch | clarify | clarify | Φ | C |
| 3-MASTER = B | volume +1 | squelch | clarify | clarify | Φ | C |
| 4-SLAVE = A | volume +1 | squelch | clarify | clarify | Φ | C |

SQUELCH CHANGE

KEY SEQ. = S↓ or S↑
L1, L2 MESSAGE SEQUENCE:
Same as for volume change, except the squelch digit is updated instead of the volume digit.
CLARIFY CHANGE
KEY SEQ. = Δ↓ or Δ↑
L1, L2 MESSAGE SEQUENCE:
Same as for volume change, except the clarify
digits are updated instead of the volume digit.
CHANNEL CHANGE
KEY SEQ. = C↓ or C↑
L1, L2 MESSAGE SEQUENCE:

| | | | | | | |
|---|---|---|---|---|---|---|
| 1-MASTER = C | Φ | Φ | | Φ | Φ | C |
| 2-SLAVE = C | channel number | channel number | Mode | signal strength | status | C |
| 3-MASTER = D | channel number +1 | | Mode | Φ | Φ | C |
| 4-SLAVE = C | channel number +1 | | Mode | signal strength | status | C |

Repeat messages 3 and 4 until key is released.
CLEAR CHANNEL
KEY SEQ. = CC↓ or CC↑
L1, L2 MESSAGE SEQUENCE:
Same as for channel change, except the master
checks each message 4 for the presence of a
clear channel, and stops the 3-4 sequence when
a clear channel is found.
BUSY CHANNEL
KEY SEQ. = BC
L1, L2 MESSAGES:
Same as for clear channel, except master
checks message 4 for a busy channel.
SENSE STANDING WAVE RATIO
KEY SEQ. = SWR
L1, L2 MESSAGES:

| | | | | | | |
|---|---|---|---|---|---|---|
| 1-MASTER = E | C | Φ | Φ | Φ | Φ | C |
| 2-SLAVE = F | VSWR | VSWR | Φ | Φ | Φ | C |
| 3-MASTER = C | Φ | Φ | Φ | Φ | Φ | C |
| 4-SLAVE = C | channel number | channel number | Mode | signal strength | status | C |

Steps 3 and 4 occur when key is released.
ASSIGN A SEL. CALL NUMBER TO TRANSCEIVER
KEY SEQ. = N1, N2, N3, N4, N5, # where N1–N5
        is the selective call number; then
        depress key "0".
L1, L2 MESSAGE SEQUENCE:

| | | | | | | |
|---|---|---|---|---|---|---|
| 1-MASTER = 0 | N1 | N2 | N3 | N4 | N5 | C |
| 2-SLAVE = C | channel number | channel number | Mode | signal strength | status | C |
| 3-MASTER = E | 2 | Φ | Φ | Φ | Φ | C |
| 4-SLAVE = C | channel number | channel number | Mode | signal strength | status | C |

TRANSMIT A SEL. CALL NUMBER
KEY SEQ. = N1, N2, N3, N4, N5, # where N1–N5 is the
        call number to be transmitted; then depress
        Key "1".
L1, L2 MESSAGE SEQUENCE:

| | | | | | | |
|---|---|---|---|---|---|---|
| 1-MASTER = 1 | N1 | N2 | N3 | N4 | N5 | C |
| 2-SLAVE = C | | | | | | C |
| 3-MASTER = E | 4 | Φ | Φ | Φ | Φ | C |
| 4-SLAVE = C | | | | | | C |

The digits N1–N5 are transmitted subsequently,
when the push to talk key "PTT" is depressed.
PUSH TO TALK
KEY SEQ. = DEPRESS PTT
L1, L2 MESSAGE SEQUENCE (W/o SEL. CALL)

| | | | | | | |
|---|---|---|---|---|---|---|
| 1-MASTER = E | 8 | Φ | Φ | Φ | Φ | C |
| 2-SLAVE = C | channel number | channel number | Mode | signal strength | status | C |

L1, L2 MESSAGE SEQUENCE (W. SEL. CALL)

| | | | | | | |
|---|---|---|---|---|---|---|
| 1-MASTER = E | A | Φ | Φ | Φ | Φ | C |

2-SLAVE = SAME AS ABOVE
L1, L2 MESSAGE SEQUENCE (W. SEL. CALL & DIGITAL CALL MESSAGE)

| | | | | | | |
|---|---|---|---|---|---|---|
| 1-MASTER = E | A | Φ | Φ | Φ | Φ | C |

2-SLAVE = SAME AS ABOVE
KEY SEQ. = RELEASE PTT
L1, L2 MESSAGE SEQUENCE

| | | | | | | |
|---|---|---|---|---|---|---|
| 1-MASTER = E | 4 | Φ | Φ | Φ | Φ | C |

2-SLAVE = SAME AS ABOVE

All of the previously described details may be interrelated by considering typical transceiver operations in conjunction with the transceiver block diagrams of FIGS. 2 and 13. Referring to FIG. 2, for example, suppose an operator wishes to operate on channel 1 in the lower sideband mode. Utilizing keyboard 3,700, the operator sequentially depresses digit keys 0 and 1, and control key LB. In response thereto, processor 3,600 senses the depressed keys, and sends messages via leads 3,510 to the slave processor 3,500. These messages were detailed in Table VI under the heading "Channel Select and Mode."

Slave processor 3,500 interprets the messages and in response thereto sends microcommands to registers 3,400 via leads 3,501. The microcommands indicate clocking frequencies $f_{S1}$, $f_{S2}$, $f_{S3}$, such that the lower sideband of channel 1 will pass through the received signal path. The previously described Table IV indicates the details of these microcommands. In particular, the microcommands will indicate an $N_1$ of 9,536; and $N_4$ of 55; an $N_5$ of 19,125; and an $N_6$ of 235. Recall that the values of $N_2$ and $N_3$ are fixed at 1,432 and 10, respectively. As a result of these microcommands, clocking module 3,100 generates clocking signal S202 of a frequency 23.84MHZ. Similarly, clocking module 3,200 generates clocking signal S702 with frequency 86,932 and also generates clocking signal S902 with a frequency of 20,345HZ.

Mixer 200 mixes signals S2 and frequency $f_{S1}$ to thereby generate signals S3 on lead 201. Frequency $f_{S1}$ was chosen such that channel 1 of signal S3 is centered at frequency 3.125 MHZ because mixer 200 includes a tank circuit having a resonant frequency of 3.125 MHZ. As such, signal S3 discriminates between the selected channel and the surrounding channels.

Mixer 300 mixes signal S3 with the fixed frequency of 3.58MHZ. The difference between 3.58MHz and 3.125MHZ equals 455KHZ; and mixer 300 includes a tank circuit having a center frequency of 455KHZ. Thus, the output of mixer 300, which is signal S4, contains channel 1 at 455KHZ.

Signal S4 is coupled to CCD filter 700 through a switch 600. Switch 600 is controlled by microcommands from processor 3,500. The microcommands are generated in response to the manually activated PTT key on keyboard 3,700.

Filter 700 receives signals S5 and filters the lower sideband from the signal in response to frequency $f_{S2}$ of clocking signals S702. The previously described Table III lists the appropriate $f_{S2}$ frequency. Signal S8, which is the output of the filter, is the lower sideband of channel 1 as the operator selected.

Signal S8 passes through the modulator 900. The modulator 900 simultaneously receives clocking signals on leads 902 which contain the third selectable frequency $f_{S3}$. Demodulator 900 samples the selected sideband signals at frequency $f_{S3}$; and as a result, the selected sideband is frequency shifted to the audio range.

The demodulator output is coupled via lead 901 to volume control unit 1,000, which amplifies its inputs signals in response to microcommands. These microcommands are entered into register 3,400 by processor 3,500 in response to messages from processor 3,600 indicating that the operator depressed the V ↑ or V ↓ key. Audio amplifier 1,100 amplifies the output of the volume control unit, and the output of the amplifier is coupled to speaker 1,200.

When the operator wishes to transmit on his selected channel, he simply pushes the PTT key on keyboard 3,700. As a result, processor 3,600 sends a message to the slave processor 3,500 via leads 3,510, as indicated in Table VI. In response thereto, processor 3,500 generates microcommands which couple the input to filter 700 to the transmit path, and which couple the antenna to the transmit path.

Additionally, processor 3,500 generates microcommands which couple selective call unit 6,300 to the transmit path lead 5,201 via switch 5,200. These microcommands are generated in a sequence such that a frequency of 1,667HZ is first transmitted for a period of several milliseconds. During this time interval, microprocessor 3,500 monitors the magnitude of the forward travelling waves and the reverse travelling waves on antenna 10. This is accomplished by selecting the SWR output by microcommand via analog multiplexer 2,300, and by monitoring the magnitude of the selected signals via leads 2,401.

Note also that during this time period, the receiving transceiver will have its squelch broken, and thus will enable its autolock logic 2,600 via microcommand from processor 3,500. The receiving transceiver monitors the actual frequency transmitted by enabling autolock unit 2,600, by sending microcommands to multiplexer 2300 which select the autolock unit, and by reading signals on leads 2,401. The receiving transceiver then compares the actual frequency of the carrier with the nominal frequency, and makes adjustments to frequency $f_{S2}$ which compensate for any differences. In one embodiment, the receiving unit makes the adjustments by modifying multiplier N5 in clocking module 3,200.

Subsequently, the transmitting unit utilizes the selective call circuitry 6,300 to perform an autocall function (if the operator has so specified via keyboard 3,700). To this end, processor 3,500 generates microcommands which sequentially couple the 1 frequency and the 0 frequency of the selective call unit 6,300 to the transmit path via switch 5,200. Each bit comprising the selective call number is broadcast for only several milliseconds, and thus the entire operation is completed in a fraction of a second. Thus, the SWR monitoring function, the autolock function, and the selective call function are all easily performed between the time that the operator depresses a pushed PTT key and the time in which he begins to speak. After the last bit of the selective call message is transmitted, processor 3,500 generates the microcommand to switch 5,200 which couples signals S52 through the switch thereby enabling speech transmissions. Alternatively, if the operator has specified a digital control message for transmission, then processor 3500 will broadcast the bits of that message following transmission of the selective call number.

Various embodiment of the invention have now been described in detail. Since it is obvious that many changes and modifications can be made in the above details without departing from the nature and spirit of the invention, it is understood that the invention is not to be limited to said details except as set forth in the appended claims.

What is claimed is:

1. A dual digital processor radio signal transmitter comprised of first and second units coupled together by a pair of wires,
   (a) said first unit being a hand-held control unit including:
      (i) keyboard means having a plurality of manually actuatable keys for selecting operating functions of said transmitter and for selecting channels, and
      (ii) first digital processor means having inputs coupled to said keyboard means for receiving logic signals of a first coded format from said keyboard means and having outputs coupled to said pair of wires for generating thereon bit-serial messages of a second format indicative of the selected operating functions and channels; and
   (b) said second unit including:
      (i) a digitally controlled transmitter circuit for transmitting selected modulated radio signals over selected channels, and
      (ii) second digital processor means having inputs coupled to said pair of wires for receiving said bit-serial messages from the outputs of said first digital processor means, said second digital processor means being coupled to said digitally controlled transmitter circuit for controlling the operation of said transmitter circuit according to the operating function selected by actuation of said keys and for controlling the channel over which said selected modulated ratio signals are transmitted in accordance with the channel selected by actuation of said keys.

2. The transmitter according to claim 1 wherein said transmitter circuit includes circuitry for serially transmitting digitally coded radio signals and wherein said second digital processor means controls said transmitter circuit to transmit a digitally coded signal in accordance with a manually actuated key sequence of said keyboard means which sequence is received as a bit-serial message over said pair of wires from said first digital processor means.

3. The transmitter according to claim 2 wherein said circuit is a selective call circuit which transmits said digitally coded signal for turning on a selected radio receiver which is responsive to digitally coded signal prior to transmission of audio information to said receiver.

4. A dual digital processor transceiver comprised of first and second units connected by a cable,
   (a) said first unit being a hand-held-unit including:
      (i) keyboard means having a plurality of manually actuatable keys for selecting operating modes of said transceiver including transmit and receive modes and for selecting frequency channels,
      (ii) first digital processor means having inputs coupled to said keyboard means for receiving logic signals of a first coded format from said keyboard means and having outputs coupled to a first pair of conductors in said cable for generating thereon bit-serial messages indicating the selected operating mode and channel of said transceiver, and
      (iii) a transducer device coupled to a second pair of conductors in said cable, said transducer device for receiving audio signals and transmitting electrical signals corresponding thereto over said second pair of conductors; and
   (b) said second unit including
      (i) a transmitter circuit coupled to said transducer device via said second pair of conductors in said cable for transmitting modulated radio signals corresponding to said electrical signals,
      (ii) a receiver circuit including a speaker device for generating audio signals in accordance with received modulated radio signals,
      (iii) a digitally controlled channel selector circuit for selecting transmission channels for said transmitter and receiver circuits,
      (iv) an electrically activatable switch circuit for selecting one to said transmitter and receiver circuits, and
      (v) a second digital processor means having an output means coupled to said channel selector circuit and to said electrically activatable switch circuit and having an input means coupled to said first pair of conductors for receiving said bit-serial messages transmitted over said first pair of conductors said second digital processor means controlling said switch circuit to selectively switch said receiver into one of said transmit and receive modes and controlling said channel selector circuit to control the frequency channel over which said modulated radio signals are transmitted and received.

5. The transceiver according to claim 4 wherein said channel selector circuit is comprised of mixer circuit means responsive to the frequency of a first input signal for shifting the frequency of a second input signal, filter means for filtering out all but a given bandwidth of said shifted signal and digitally controllable frequency generator means coupled to said second digital processor means and to said mixer means for generating said second frequency signal at a frequency selected by said second digital processor means.

6. The transceiver according to claim 4 wherein said first digital processor means also receives bit serial messages from said second digital processor means over said first pair of conductors.

7. The transceiver according to claim 4 wherein said receiver circuit includes a digitally controlled volume control circuit for controlling the audio output volume of said speaker device, said volume control circuit being coupled to said second digital processor means and responsive to bit-serial messages from said first digital processor means for controlling said volume control means in response to actuation of up-volume and down-volume operation mode keys of said keyboard means.

8. The transceiver according to claim 4 including a digitally operable squelch circuit coupled to said second digital processor means for controlling the squelch of said transceiver in accordance with bit-serial messages transmitted over said first pair of conductors from said first digital processor means to said second digital processor means in response to actuation of squelch adjustment mode keys of said keyboard means.

9. The transceiver according to claim 4 wherein said transmitter circuit includes a selective call circuit which causes said transceiver to transmit digitally coded signals for turning on a selected radio receiver prior to transmission of audio information to said selected radio receiver, said selective call circuit being coupled to and controlled by said second digital processor means in accordance with a manually actuated key sequence of said keyboard means when a selective call mode is selected by a key of said keyboard means, said selective call mode and said sequence being received as a bit serial message over said first pair of wires from said first digital processor means.

10. The transceiver according to claim 9 wherein said first digital processor means is a master digital processor and said second digital processor means is a slave digital processor which controls said transceiver and generates bit-serial messages for said first digital processor means only in response to bit-serial messages receives from said first digital processor means.

11. The transceiver according to claim 9 wherein said first hand-held unit further includes digital display means coupled to outputs of said first digital processor means for displaying alphanumeric characters in response to signals generated by said first digital processor means in response to bit-serial messages received from said second digital processor means.

12. The transceiver according to claim 11 wherein said second unit includes a standing wave ratio measuring circuit coupled to said second digital processor means, said second digital processor means being responsive to a measured standing wave ratio for generating a bit-serial message to said first microprocessor means in accordance therewith when a signal measurement mode is selected by actuation of a key of said keyboard means, said first microprocessor means being responsive to said bit-serial message for causing said standing wave ratio to be displayed by said display means.

* * * * *